(12) United States Patent
Akagawa et al.

(10) Patent No.: US 6,936,950 B2
(45) Date of Patent: Aug. 30, 2005

(54) MICRO-ACTUATOR UTILIZING ELECTROSTATIC AND LORENTZ FORCES, AND MICRO-ACTUATOR DEVICE, OPTICAL SWITCH AND OPTICAL SWITCH ARRAY USING THE SAME

(75) Inventors: Keiichi Akagawa, Kamakura (JP); Junji Suzuki, Hachioji (JP); Tohru Ishizuya, Tokyo (JP); Yoshihiko Suzuki, Funabashi (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/792,427

(22) Filed: Mar. 2, 2004

(65) Prior Publication Data

US 2004/0183395 A1 Sep. 23, 2004

Related U.S. Application Data

(63) Continuation of application No. PCT/JP02/09023, filed on Sep. 5, 2002.

(30) Foreign Application Priority Data

Sep. 17, 2001 (JP) ........................................ 2001-282421
Dec. 3, 2001 (JP) ........................................ 2001-368060

(51) Int. Cl.⁷ .......................... H02N 1/00; G02B 26/08; G02B 26/10
(52) U.S. Cl. ........................ 310/309; 385/18; 359/223
(58) Field of Search .................... 310/309; 385/16–18; 359/222–224; 251/65, 129.05, 129.01

(56) References Cited

U.S. PATENT DOCUMENTS

| 5,322,258 A | * | 6/1994 | Bosch et al. ................... 251/65 |
| 6,198,565 B1 | * | 3/2001 | Iseki et al. ................... 359/224 |
| 6,381,381 B1 | * | 4/2002 | Takeda et al. ................ 385/16 |
| 6,658,177 B1 | * | 12/2003 | Chertkow ..................... 385/18 |

FOREIGN PATENT DOCUMENTS

| JP | 05-253870 | 10/1993 | .............. B25J/7/00 |
| JP | 08-088984 | 4/1996 | .............. H02N/1/00 |
| JP | 2001-042233 A | 2/2001 | ........... G02B/26/08 |
| JP | 2001-076605 A | 3/2001 | .......... H01H/59/00 |
| WO | 03/024864 | * 3/2003 | .............. B81B/3/00 |

* cited by examiner

*Primary Examiner*—Karl Tamai
(74) *Attorney, Agent, or Firm*—Frishauf, Holtz, Goodman & Chick, P.C.

(57) ABSTRACT

The movable part 21 is fastened to the substrate 11 via flexure parts 27a and 27b, and can move upward and downward with respect to the substrate 11. The substrate 11 also serves as a fixed electrode. The movable part 21 has second electrode parts 23a and 23b which can generate an electrostatic force between these electrode parts and the substrate 11 by means of a voltage that is applied across these electrode parts and the substrate 11, and a current path 25 which is disposed in a magnetic field, and which generates a Lorentz force when a current is passed through this current path. A mirror 12 which advances into and withdraws from the light path is disposed on the movable part 21. As a result, the mobility range of the movable part can be broadened, and the power consumption can be reduced, without applying a high voltage or sacrificing small size.

17 Claims, 15 Drawing Sheets

MICRO-ACTUATOR UTILIZING ELECTROSTATIC AND LORENTZ FORCES, AND MICRO-ACTUATOR DEVICE, OPTICAL SWITCH AND OPTICAL SWITCH ARRAY USING THE SAME

The present application is a continuation of PCT International Application No. PCT/JP02/09023 filed Sep. 5, 2002, which is hereby incorporated by reference.

TECHNICAL FIELD

The present invention relates to a microactuator, a microactuator device, an optical switch and an optical switch array.

BACKGROUND ART

As advances have been made in micro-machining techniques, the need for microactuators has increased in various fields. Optical switches which switch light paths utilized in optical communications, etc., may be cited as one example of a field in which microactuators are used. For instance, the optical switch disclosed in Japanese Patent Application Kokai No. 2001-42233 may be cited as one example of such an optical switch.

Microactuators generally have a fixed part, and a movable part that can be moved by a specified force, and are held in a specified position by the above-mentioned specified force. In conventional microactuators, an electrostatic force is often used as the above-mentioned specified force. For example, in the case of the microactuator that moves a micro-mirror used in the optical switch disclosed in Japanese Patent Application Kokai No. 2001-42233, the movable part can be moved to an upper position (position in which the micro-mirror reflects the incident light) or a lower position (position in which the micro-mirror allows the incident light to pass through "as is"), and can be held in these positions, by an electrostatic force.

In such microactuators that utilize an electrostatic force, a first electrode part is disposed on the fixed part, a second electrode part is disposed on the movable part, and an electrostatic force is generated between the first and second electrode parts by applying a voltage across these electrode parts.

However, in the case of conventional microactuators using an electrostatic force as described above, the movable part is moved by an electrostatic force and held in a specified position by an electrostatic force; accordingly, it is difficult to broaden the range of mobility of the movable part.

The electrostatic force F1 that acts between parallel flat-plate electrodes is as shown in the following Equation (1), where $\epsilon$ is the dielectric constant, V is the potential difference, d is the inter-electrode distance, and S is the electrode surface area.

$$F1 = \epsilon \times V^2 \times S / (2d^2) \tag{1}$$

As is seen from Equation (1), the electrostatic force F1 decreases abruptly in inverse proportion to the square of the inter-electrode distance d as the inter-electrode distance d increases. Accordingly, in the case of the above-mentioned conventional microactuators, it becomes difficult to move the movable part when the inter-electrode distance d exceeds a certain distance, so that it is difficult to broaden the mobility range of the movable part. Furthermore, if the potential difference (voltage across the electrodes) V is increased in an attempt to obtain a sufficient electrostatic force F1 in the case of a large inter-electrode distance d, problems occur in terms of the dielectric strength, and a high-voltage generating part is required. Furthermore, if the electrode surface area S is increased in an attempt to obtain a sufficient electrostatic force F1 in the case of a large inter-electrode distance d, the dimensions of the device are increased, so that miniaturization, which is the whole idea of a microactuator, is lost.

According, as a result of research, the present inventor conceived of the use of Lorentz force instead of electrostatic force in a microactuator.

It is known that the Lorentz force F2 (N) is as shown in the following Equation (2), where B is the magnetic flux density (T), L is the length of the electric wire (m), and I is the current (A).

$$F2 = I \times B \times L \tag{2}$$

Since there is no term that stipulates the position of the electric wire in Equation (2), the Lorentz force F2 that is generated at a constant magnetic flux density does not vary even if the position of the electric wire changes.

The Lorentz force can be caused to act on the movable part in a microactuator by installed a current path corresponding to the above-mentioned electric wire in the movable part, applying a magnetic field to this current path, and causing a current to flow through this current path. Even if the mobility range of the movable part is broadened compared to that of a conventional device, the application of a substantially uniform magnetic field in this range can easily be accomplished, for example, by using a magnet or the like. Accordingly, even if the mobility range of the movable part is broadened, a constant force can be caused to act on the movable part regardless of the position of the movable part. Specifically, if such a Lorentz force is used instead of an electrostatic force in a microactuator, a constant driving force can be obtained (in principle) regardless of the position of the movable part (unlike a case in which an electrostatic force which shows a variation in the driving force according to the position of the movable part is used).

For example, in the case of an inter-electrode distance of 50 $\mu$m, an electrode shape of 50 $\mu$m square, a voltage of 5 V and a dielectric constant of 1, the electrostatic force F1 according to the above-mentioned Equation (1) is 0.1 nN. On the other hand, if a current path with a length of 50 $\mu$m is created in a 50 $\mu$m square electrode, and a magnetic field with a magnetic flux density of 0.1 T is applied, a Lorentz force of 5 nN is generated when a current of 1 mA is caused to flow. In order to obtain a force of 5 nN or greater using an electrostatic force, the inter-electrode distance must be set at 7 $\mu$m or less, or else the electrode shape must be set at 350 $\mu$m or greater. Accordingly, it is seen that the Lorentz force is more advantageous for obtaining the same driving force.

Furthermore, for example, if a 20 mm square neodymium-iron-boron-type magnet is disposed in a position that is separated from the microactuator by a distance of 2 mm, a magnetic flux density of 0.1 T can easily be obtained.

Thus, the use of a Lorentz force instead of an electrostatic force in a microactuator makes it possible to broaden the mobility range of the movable part without applying a high voltage or sacrificing small size.

However, it has been demonstrated that a new problem arises in cases where a Lorentz force is used instead of an electrostatic force in a microactuator. Specifically, in cases where a Lorentz force is used instead of an electrostatic force, the movable part is moved to a specified position by means of this Lorentz force, and the movable part continues to be held in this position by the Lorentz force. Accordingly, since the current used to generate the Lorentz force must be constantly caused to flow in a continuous manner, the power consumption is conspicuously increased.

For instance, in the case of an application involving a large-scale optical switch, several tens of thousands of actuators are installed in a single optical switch device. Accordingly, there is a strong demand for a reduction in the power consumption of the respective actuators. For example, in the case of an optical switch with 100×100 channels, it is essential that (for example) MOS switches for selecting the channels be manufactured on a semiconductor substrate. Assuming that the resistance of one MOS switch is 10 kΩ, then in a case where a current of 1 mA is caused to flow continuously through this switch, the power consumption of one MOS switch is 10 mW. In a case where the total number of MOS switches is 10,000, the power consumption is as high as 100 W. As a result, the amount of heat generated is excessively large, so that there are problems in terms of practical use.

DISCLOSURE OF THE INVENTION

The present invention was devised in order to solve such problems. The object of the present invention is to provide a microactuator, microactuator device, optical switch and optical switch array which can broaden the mobility range of the movable part and reduce the power consumption without applying a high voltage or sacrificing small size.

As a result of further research, the present inventor discovered that the above-mentioned object can be achieved by constructing a microactuator so that the utilization of an electrostatic force and the utilization of a Lorentz force can be coupled. Specifically, the present inventor discovered that the above-mentioned object can be achieved in a microactuator which comprises a fixed part and a movable part that is disposed so that this movable part can move with respect to the above-mentioned fixed part, by respectively disposing on the fixed part and movable part electrode parts which are used in order to make it possible to cause an electrostatic force to act on the movable part, and disposing in the movable part a current path which is used to cause a Lorentz force to act on the movable part.

By using such means, for example, it is possible to move the movable part by means of a Lorentz force alone in cases where the distance between the electrode part of the movable part and the electrode part of the fixed part is large, and to hold the movable part by means of an electrostatic force alone in cases where the distance between the electrode part of the movable part and the electrode part of the fixed part is decreased. As a result, the mobility range of the movable part can be broadened, and the power consumption can be reduced, without applying a high voltage or sacrificing small size.

In the case of driving by an electrostatic force, since the charging-discharging of a capacitor is performed electrically, power consumption occurs only during charging and discharging, i.e., at points in time at which there is a change in the voltage. Accordingly, in cases where the movable part does not move frequently, so that the period for which the movable part is held in a specified position (a position which is such that the distance between the electrode part of the fixed part and the electrode part of the movable part is small) is relatively long, as in a microactuator used in an optical switch, etc., the power consumption can be greatly reduced if the force that is used to hold the movable part in the specified position is generated only by an electrostatic force. For example, in a case where the inter-electrode capacitance is 10 pF, the voltage is 5 V and the movement of the movable part occurs once per minute, the power consumption of electrostatic driving is 4.2 pW. In a case where the number of such microactuators used is 10,000, the total power consumption of electrostatic driving is 42 nW. Furthermore, in the case of a position where the distance between the electrode part of the fixed part and the electrode part of the movable part is small, an electrostatic force of a sufficient magnitude can be obtained even if the voltage across the two electrode parts is relatively low and the electrode surface area is relatively small.

In the case of driving by a Lorentz force, a constant driving force can be obtained regardless of the position of the movable part; accordingly, if the movable part is moved by means of such a Lorentz force, the mobility range can be broadened. The power consumption of such a Lorentz force is as follows: for example, assuming that the resistance of the on-chip MOS switches for selecting the channels is 10 kΩ as in the example described above, then, in a case where a current of 1 mA is caused to flow through this MOS switch for 10 msec each minute (corresponding to the movement period of the movable part), the power consumption of Lorentz force driving is 1.7 μW. In a case where the number of microactuators is 10,000, the total power consumption of Lorentz force driving is 17 mW, so that the power consumption is greatly reduced compared to the power consumption of 100 W that occurs in the case of the above-mentioned constant Lorentz force driving. Almost all of the total power consumption is accounted for by the Lorentz force; however, this is not a major problem in practical terms.

Thus, by mounting both a device that generates an electrostatic force and a device that generates a Lorentz force in a microactuator, it is possible (for example) to reduce the power consumption by generating the force that is used to hold the movable part in a specified position by means of an electrostatic force, and to drive the microactuator by means of a Lorentz force in cases where the gap between the movable electrode and the fixed electrode is large, so that the mobility range can be broadened while preventing the application of a high voltage and an increase in the electrode surface area.

The present invention was devised on the basis of the novel findings obtained as a result of the above-mentioned research conducted by the present inventor.

Specifically, the first invention that is used in order to achieve the object is a microactuator (a) which comprises a fixed part and a movable part that is disposed so that this movable part can move with respect to the fixed part, (b) in which the fixed part has a first electrode part, and (c) in which the movable part has a second electrode part that can generate an electrostatic force between this second electrode part and the first electrode part by means of a voltage applied across the first electrode part and this second electrode part, and a current path that is disposed in a magnetic field and that generates a Lorentz force when current is passed through this current path.

The second invention that is used in order to achieve the object is the first invention, which is further characterized by the fact that the movable part is constructed from a thin film.

In this invention, since the movable part is formed by a thin film, the size and weight of the movable part can be reduced, and the power consumption can be reduced. Furthermore, since the movable part can be manufactured by a semiconductor process, the manufacturing cost can be reduced, and the formation of an array is easy.

The third invention that is used in order to achieve the object is the first invention or second invention, which is further characterized by the fact that the current path is disposed so that a Lorentz force can be generated in a direction that causes the movable part to move into a first position where the electrostatic force is increased.

In this invention, since the Lorentz force that is required in order to move the movable part into a position where the movable part is held can be efficiently applied, the power consumption for generating this Lorentz force can be reduced.

The fourth invention that is used in order to achieve the object is the third invention, which is further characterized by the fact that the movable part is disposed so that this movable part can move between the first position and a second position in which the electrostatic force drops or disappears, and so that a returning force which tends to return the movable part to the second position is generated.

In this invention, the movable part can move to a position that is not reached by the electrostatic force; accordingly, the mobility range of the movable part can be broadened. Furthermore, since the movable part is moved by the returning force when the movable part moves into the second position, no electric power is required for this movement.

The fifth invention that is used in order to achieve the object is the fourth invention, which is further characterized by the fact that (a) the first electrode part and the second electrode part are disposed facing each other, (b) the movable part is mechanically connected to the fixed part via a spring part that possesses spring properties so that the gap between the first and second electrode parts narrows when the movable part is positioned in the first position, and so that the gap widens when the movable part is positioned in the second position, and (c) the returning force is generated by the spring part.

In this invention as well, the movable part can move to a position that is not reached by the electrostatic force; accordingly, the mobility range of the movable part can be broadened. Furthermore, since the movable part is moved by the returning force when the movable part moves into the second position, no electric power is required for this movement.

The sixth invention that is used in order to achieve the object is the first invention or second invention, wherein the fixed part has a third electrode part, and the movable part has a fourth electrode part that can generate an electrostatic force between this fourth electrode part and the third electrode part by means of a voltage applied across this fourth electrode part and the third electrode part.

In this invention, the mobility range of the movable part can be further broadened.

The seventh invention that is used to achieve the object is the sixth invention, which is further characterized by the fact that the second electrode part is also used as the fourth electrode part.

In this invention, since the construction is simple, the weight of the movable part can be reduced; furthermore, since the number of manufacturing processes required is also reduced, the manufacturing cost can be reduced.

The eighth invention that is used to achieve the object is the sixth invention or seventh invention, which is further characterized by the fact that the current path is disposed so that a Lorentz force can be generated in respective directions which are such that the movable part is respectively moved into a first position where the electrostatic force that is generated between the first and second electrode parts is increased, and the electrostatic force that is generated between the third and fourth electrode parts drops or disappears, and a second position where the electrostatic force that is generated between the first and second electrode parts drops or disappears, and the electrostatic force that is generated between the third and fourth electrode parts increases.

In this invention, since the Lorentz force that is required in order to move the movable part into a position where the movable part is held can be efficiently applied, the power consumption that is required in order to generate this Lorentz force can be reduced.

The ninth invention that is used in order to achieve the object is the eighth invention, which is further characterized by the fact that the movable part is disposed so that a returning force that tends to return the movable part to a specified position between the first and second positions is generated.

In this invention, since the movable part is moved by the returning force when the movable part moves into the specified position, no electric power is required for this movement.

The tenth invention that is used in order to achieve the object is the ninth invention, which is further characterized by the fact that (a) the first electrode part is disposed facing the second electrode part on one side with respect to the movable part, (b) the third electrode part is disposed facing the fourth electrode part on the other side with respect to the movable part, (c) the movable part is mechanically connected to the fixed part via a spring part that possesses spring properties so that a first gap between the first and second electrode parts narrows and a second gap between the third and fourth electrode parts widens when the movable part is positioned in the first position, and so that the first gap widens and the second gap narrows when the movable part is positioned in the second position, and (d) the returning force is generated by the spring part.

In this invention as well, since the movable part is moved by the returning force when the movable part moves into the specified position, no electric power is required for this movement.

The eleventh invention that is used in order to achieve the object is a microactuator device which is characterized by the fact that this device comprises the microactuator of any of the first through fifth inventions, a magnetic field generating part that generates the magnetic field, and a control part that controls the voltage that is applied across the first and second electrode parts and the current that flows through the current path.

In this invention, the magnitude of the Lorentz force and the timing of the generation of this Lorentz force can be controlled; accordingly, the microactuator can be driven under appropriate conditions.

The twelfth invention that is used in order to achieve the object is the eleventh invention, which is further characterized by the fact that (a) the control part controls the voltage and the current so that the movable part is caused to move into the first position by the Lorentz force or by the Lorentz force and the electrostatic force when the movable part is moved into the first position, and (b) the control part controls the voltage so that the movable part is held in the first position by the electrostatic force, and controls the current so that this current does not flow, at least in a steady holding state in which the movable part is held in the first position.

In this invention, electric power that is used to generate the Lorentz force is required only when the movable part is moved into the first position; since only an electrostatic force is utilized in order to hold the movable part in the first position, the power consumption required for holding can be reduced.

The thirteenth invention that is used in order to achieve the object is a microactuator device which is characterized by the fact that this device comprises the microactuator of any of the sixth through tenth inventions, a magnetic field generating part that generates the magnetic field, and a control part that controls the voltage that is applied across the first and second electrode parts, the voltage that is applied across the third and fourth electrode parts, and the current that flows through the current path.

In this invention, the magnitude of the Lorentz force and the timing of the generation of this Lorentz force can be controlled; accordingly, the microactuator can be driven under appropriate conditions.

The fourteenth invention that is used in order to achieve the object is the thirteenth invention, which is further characterized by the fact that (a) the control part controls the voltage that is applied across the first and second electrode parts, the voltage that is applied across the third and fourth electrode parts and the current that flows through the current path so that the movable part is caused to move into the first position by the Lorentz force or by the Lorentz force and the electrostatic force between the first and second electrode parts when the movable part is moved into the first position, (b) the control part controls the voltage that is applied across the first and second electrode parts, the voltage that is applied across the third and fourth electrode parts and the current that flows through the current path so that the movable part is caused to move into the second position by the Lorentz force or by the Lorentz force and the electrostatic force between the third and fourth electrode parts when the movable part is moved into the second position, (c) the control part controls the voltage that is applied across the first and second electrode parts and the voltage that is applied across the third and fourth electrode parts so that the movable part is held in the first position by the electrostatic force between the first and second electrode parts, and controls the current so that this current does not flow, at least in a steady holding state in which the movable part is held in the first position, and (d) the control part controls the voltage that is applied across the first and second electrode parts and the voltage that is applied across the third and fourth electrode parts so that the movable part is held in the second position by the electrostatic force between the third and fourth electrode parts, and controls the current so that this current does not flow, at least in a steady holding state in which the movable part is held in the second position.

In this invention, electric power that is used to generate the Lorentz force is required only when the movable part is moved into the first position; since only an electrostatic force is utilized in order to hold the movable part in the first position, the power consumption required for holding can be reduced.

The fifteenth invention that is used in order to achieve the object is an optical switch which is characterized by the fact that this optical switch comprises the microactuator of any of the first through tenth inventions, and a mirror which is disposed on the movable part.

The sixteenth invention that is used in order to achieve the object is an optical switch array which is characterized by the fact that this optical switch array comprises a plurality of the optical switches that constitute the fifteenth invention, and said plurality of optical switches are disposed in a two-dimensional configuration.

The seventeenth invention that is used in order to achieve the object is the sixteenth invention, which is further characterized by the fact that this optical switch array comprises a circuit which contains a plurality of switching elements, and which controls the current and the voltage for optical switches in selected rows and columns in response to row selection signals for each row of the plurality of optical switches and column selection signals for each column of the plurality of optical switches.

BEST MODE FOR CARRYING OUT THE INVENTION

Microactuators constituting working configurations of the present invention, as well as microactuator devices, optical switches and optical switch arrays using these microactuators, will be described below with reference to the figures.

First Working Configuration

Figure 1:
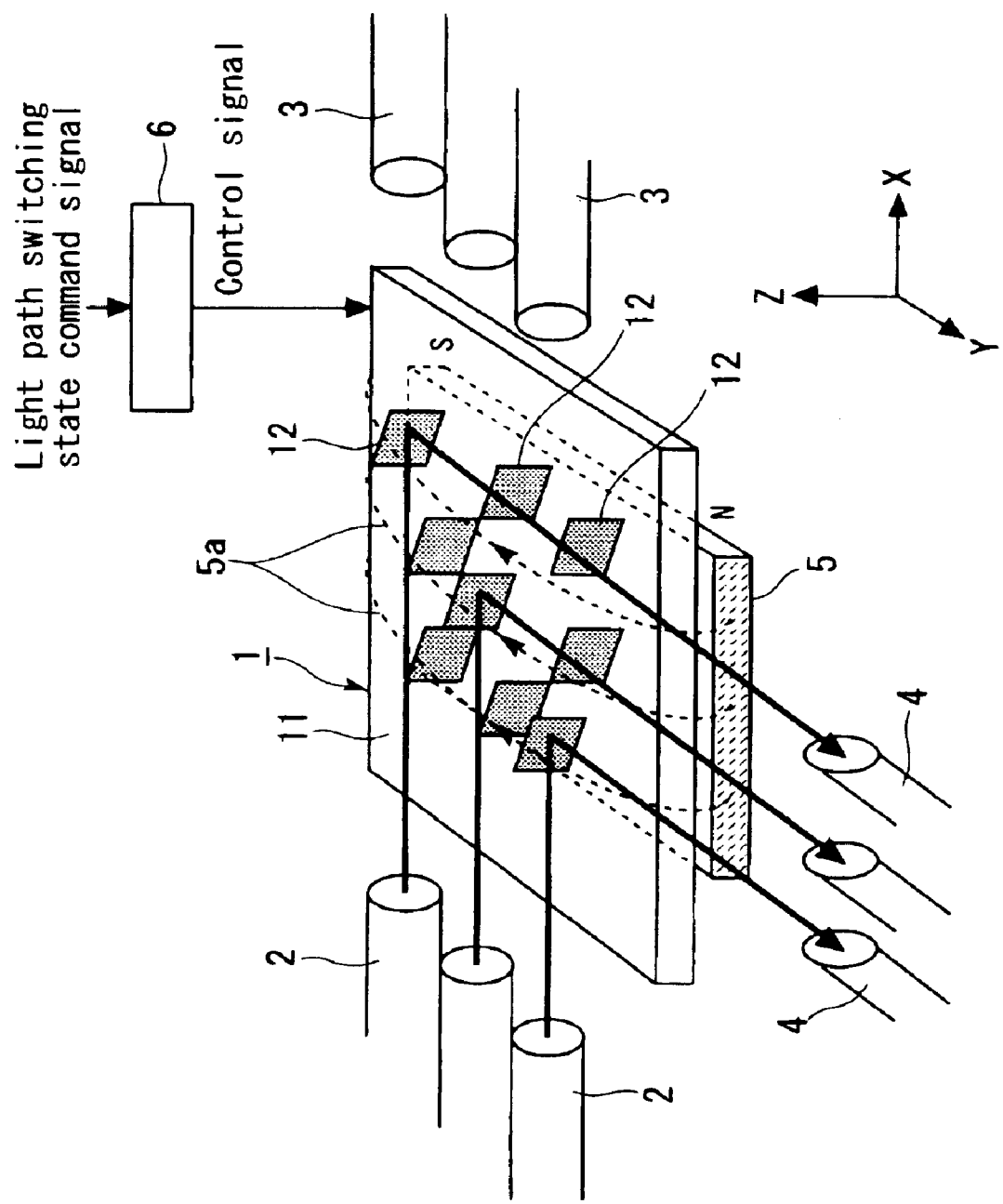
FIG. 1 is a schematic structural diagram which shows one example of an optical switch system comprising an optical switch array that constitutes a first working configuration of the present invention.

FIG. 1 is a schematic structural diagram which shows one example of an optical switch system comprising an optical switch array 1 that constitutes a first working configuration of the present invention. For convenience of description, X, Y and Z axes that are mutually perpendicular are defined as shown in FIG. 1 (the same is true of figures described later). The surface of the substrate 11 of the optical switch array 1 is parallel to the XY plane. Furthermore, for convenience of description, the + side in the direction of the Z axis is referred to as the upper side, and the − side in the direction of the Z axis is referred to as the lower side.

As is shown in FIG. 1, this optical switch system comprises an optical switch array 1, M optical fibers 2 used for light input, M optical fibers 3 used for light output, N optical fibers 4 used for light output, a magnet 5 used as a magnetic field generating part that generates a magnetic field (as will be described later) for the optical switch array 1, and an external control circuit 6 which sends control signals used to realize light path switching states indicated by light path switching state command signals to the optical switch array 1 in response to these light path switching state command signals. In the example shown in FIG. 1, M=3 and N=3; however, M and N may respectively be arbitrary numbers.

In the present working configuration, as is shown in FIG. 1, the magnet 5 is a plate-form permanent magnet which is magnetized so that the + side in the direction of the Y axis is the N pole, and the − side in the direction of the Y axis is the S pole. This magnet 5 is disposed on the underside of the optical switch array 1, and generates a magnetic field indicated by the lines of magnetic force 5a for the optical switch array 1. Specifically, the magnet 5 generates a substantially uniform magnetic field which is oriented toward the − side along the direction of the Y axis with respect to the optical switch array 1. Of course, it would also be possible to use (for example) a permanent magnet of some other shape or an electromagnet, etc., as the magnetic field generating part instead of the magnet 5.

As is shown in FIG. 1, the optical switch array 1 comprises a substrate 11 and M×N mirrors 12 which are disposed on the substrate 11. The M optical fibers 2 used for light input are disposed in a plane parallel to the XY plane so that these optical fibers guide incident light in the direction of the X axis from one side of the substrate 11 in the direction of the X axis. The M optical fibers 3 used for light output are disposed on the other side of the substrate 11 so that these optical fibers respectively face the M optical fibers 2 used for light input, and are disposed in a plane parallel to the XY plane so that light that advances in the direction of the X axis without being reflected by any of the mirrors 12 of the optical switch array 1 is incident on these optical fibers. The N optical fibers 4 used for light output are disposed in a plane parallel to the XY plane so that light that is reflected by any of the mirrors 12 of the optical switch array 1 and that therefore advances in the direction of the Y axis is incident on these optical fibers. The M×N mirrors 12 are disposed on the substrate 11 in the form of a two-dimensional matrix so that these mirrors can be moved rectilinearly in the direction of the Z axis by microactuators (described later) in a manner that allows the mirrors to advance into and withdraw from the respective intersection points between the exit light paths of the M optical fibers 2 used for light input and the entry light paths of the optical fibers 4 used for light output. In the present example, furthermore, the orientation of the mirrors 12 is set so that the normal of these mirrors forms a 45° angle with the X axis in the plane parallel to the XY plane. Of course, this angle may be appropriately altered, and in cases where the angle of the mirrors 12 is altered, the orientation of the optical fibers 4 used for light output may be set in accordance with this angle. Furthermore, in this example, the mechanism that drives the mirrors 12 is a microactuator.

In this optical switch system, the light path switching principle itself is the same as the light path switching principle of a conventional two-dimensional optical switch.

Figure 2:
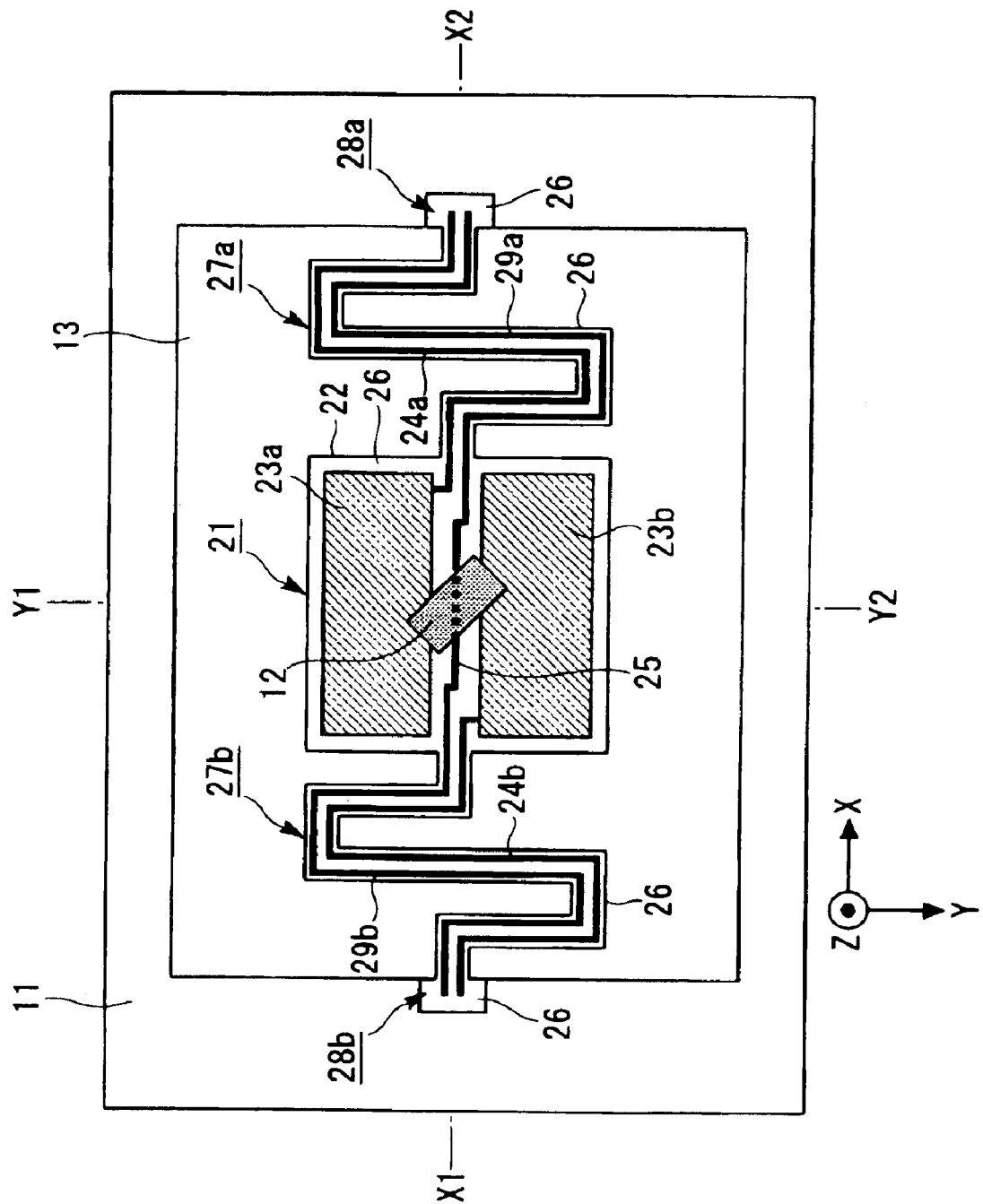
FIG. 2 is a schematic plan view which shows one of the optical switches constituting the optical switch array shown in FIG. 1.
Figure 3:
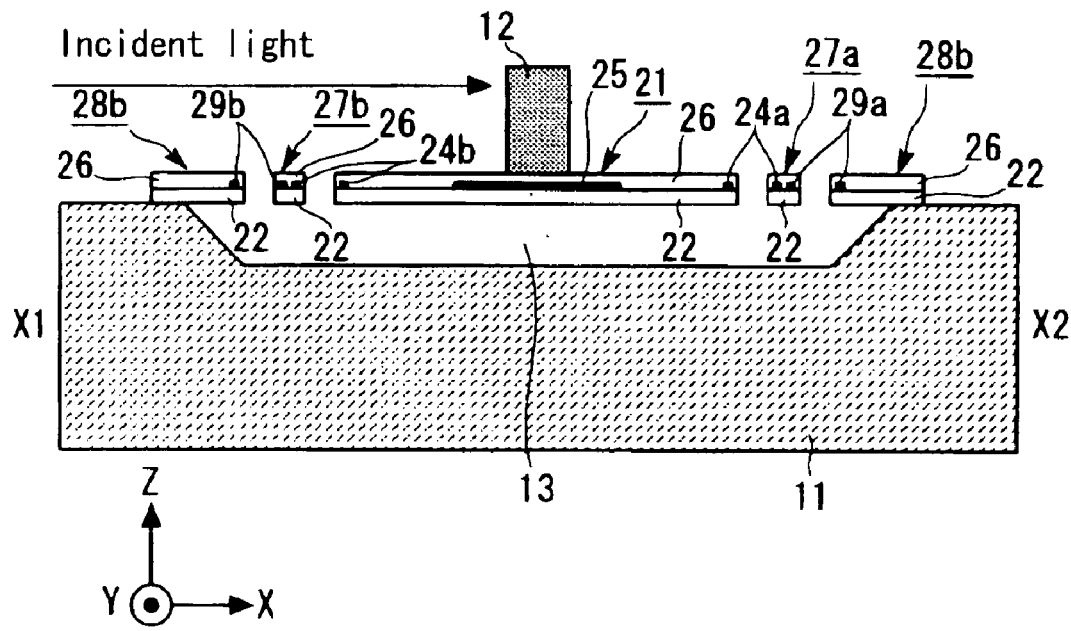
FIG. 3 is a schematic sectional view along line X1–X2 in FIG. 2.
Figure 4:
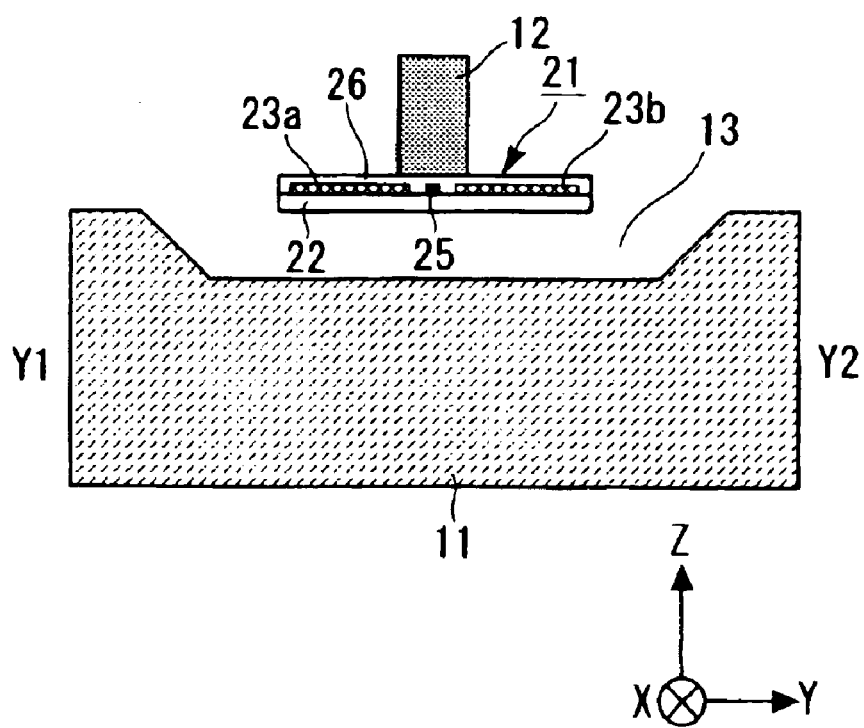
FIG. 4 is a schematic sectional view along line Y1–Y2 in FIG. 2.
Figure 5:
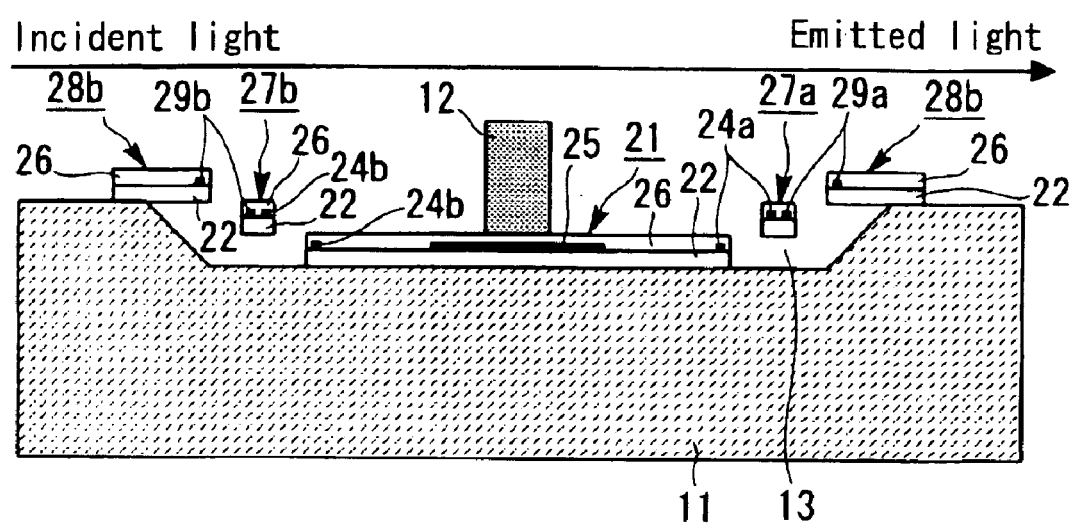
FIG. 5 is a schematic sectional view corresponding to FIG. 3.
Figure 5:
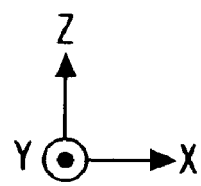

Next, the structure of one of the optical switches used as a unit element in the optical switch array 1 shown in FIG. 1 will be described with reference to FIGS. 2 through 5. FIG. 2 is a schematic plan view which shows one optical switch. FIG. 3 is a schematic sectional view along line X1–X2 in FIG. 2. FIG. 4 is a schematic sectional view along line Y1–Y2 in FIG. 2. FIG. 5 is a schematic sectional view corresponding to FIG. 3, and shows a state in which the mirror 12 is held on the lower side. Furthermore, FIG. 3 shows a state in which the mirror 12 is held on the upper side.

Besides the above-mentioned mirror 12 and the above-mentioned substrate 11 used as a fixed part, this optical switch comprises a movable plate 21 used as a movable part which is disposed so that this part can move with respect to the substrate 11. A recessed part 13 constituting a region into which the movable plate 21 advances is formed on the substrate 11. In the present working configuration, a semiconductor substrate such as a silicon substrate is used as the substrate 11, and the portion of the substrate 11 that faces the movable plate 21 constitutes a first electrode part. Of course, it would also be possible to form a first electrode part separately from the substrate 11 by means of a metal film, etc., on the substrate 11.

The movable plate 21 is formed by a thin film, and comprises a lower-side insulating film 22, two second electrode parts 23a and 23b which are formed on the lower-side insulating film 22, portions of wiring patterns 24a and 24b which are formed on the lower-side insulating film 22 and which are respectively used for the electrical connection of the electrode parts 23a and 23b to specified locations on the substrate 11, a coil layer 25 which is formed on the lower-side insulating film 22 and which is used as a current path that is disposed in the magnetic field generated by the magnet 5 shown in FIG. 1 and that generates a Lorentz force when a current is passed through this coil layer, and an upper-side insulating film 26 which covers the upper sides of the above-mentioned elements. The second electrode parts 23a and 23b can generate an electrostatic force between these electrode parts 23a and 23b and the substrate 11 (which constitutes the above-mentioned first electrode part) by means of a voltage that is applied across these electrode parts and the substrate 11.

For example, SiN films or $SiO_2$ films, etc., can be used as the insulating films 22 and 26. Furthermore, for example, metal films, etc., such as Al films can be used as the electrode parts 23a and 23b, wiring patterns 24a and 24b and coil layer 25. Furthermore, since the electrode parts 23a and 23b, portions of the wiring patterns 24a and 24b and coil layer 25 are covered by the upper-side insulating film 26, these parts should actually be shown by hidden lines in FIG. 2; however, for convenience of graphic illustration, the parts hidden by the upper-side insulating film 26 are also indicated by solid lines. However, the portion of the coil layer 25 that is hidden by the mirror 12 is indicated by hidden lines.

In the present working configuration, both end portions of the movable plate 21 in the direction of the X axis are mechanically connected to the peripheral parts of the recessed part 13 in the substrate 11 via flexure parts 27a and 27b used as spring parts that have spring properties, and anchoring parts 28a and 28b, in that order. The flexure parts 27a and 27b and anchoring parts 28a and 28b are constructed by the lower-side insulating film 22, the remaining portions of the above-described wiring patterns 24a and 24b, wiring patterns 29a and 29b that are respectively used for the electrical connection of the coil layer 25 to specified locations on the substrate 11, and the upper-side insulating film 26, all of which extend "as is" as continuations of the movable plate 21. Furthermore, the wiring patterns 29a and 29b extend "as is" as continuations of the metal film, etc., constituting the coil layer 25. In the anchoring parts 28a and 28b, the wiring patterns 24a, 24b, 29a and 29b are respectively electrically connected to specified locations on the substrate 11 via holes (not shown in the figures) formed in the lower-side insulating film 22. The wiring patterns 24a and 24b are electrically connected in common by wiring (not shown in the figures) formed on the substrate 11.

As is shown in FIG. 2, the flexure parts 27a and 27b have a meandering shape as seen in a plan view. As a result, the movable plate 21 can move upward and downward (in the direction of the Z axis). Specifically, in the present working configuration, the movable plate 21 can move between an upper position (second position) (see FIGS. 3 and 4) to which the movable plate 21 is returned by spring force (returning force) of the flexure parts 27a and 27b when no electrostatic force or Lorentz force is acting on the movable plate 21, and a lower position (first position) (see FIG. 5) in which the movable plate 21 advances into the recessed part 13 of the substrate 11 and contacts the bottom part of this recessed part 13. In the upper position shown in FIGS. 3 and 4, the gap between the second electrode parts 23a and 23b of the movable plate 21 and the substrate 11 used as the first electrode part is widened, so that the electrostatic force that can be generated between these parts drops or disappears. In the lower position shown in FIG. 5, the gap between the second electrode parts 23a and 23b of the movable plate 21 and the substrate 11 used as the first electrode part is narrowed, so that the electrostatic force that can be generated between these parts is increased.

The coil layer 25 is disposed so that a Lorentz force can be generated in a direction (downward direction) that causes the movable plate 21 to move into the lower position shown in FIG. 5, where the above-mentioned electrostatic force is increased. In concrete terms, in the present working configuration, since a magnetic field which is oriented toward the − side is generated along the direction of the Y axis by the magnet 5 shown in FIG. 1 as described above, the coil layer 25 is disposed so that this layer extends along the direction of the X axis as shown in FIG. 1.

The mirror 12 is fastened to the upper surface of the movable plate 21 in an upright attitude. As was described above, the orientation of the reflective surface of the mirror 12 is set so that the normal of this reflective surface forms an angle of 45° with the X axis in the plane parallel to the XY plane.

A microactuator which drives the mirror 12 is formed by the constituent elements other than the mirror 12 in the structure of the above-mentioned optical switch.

Figure 6:
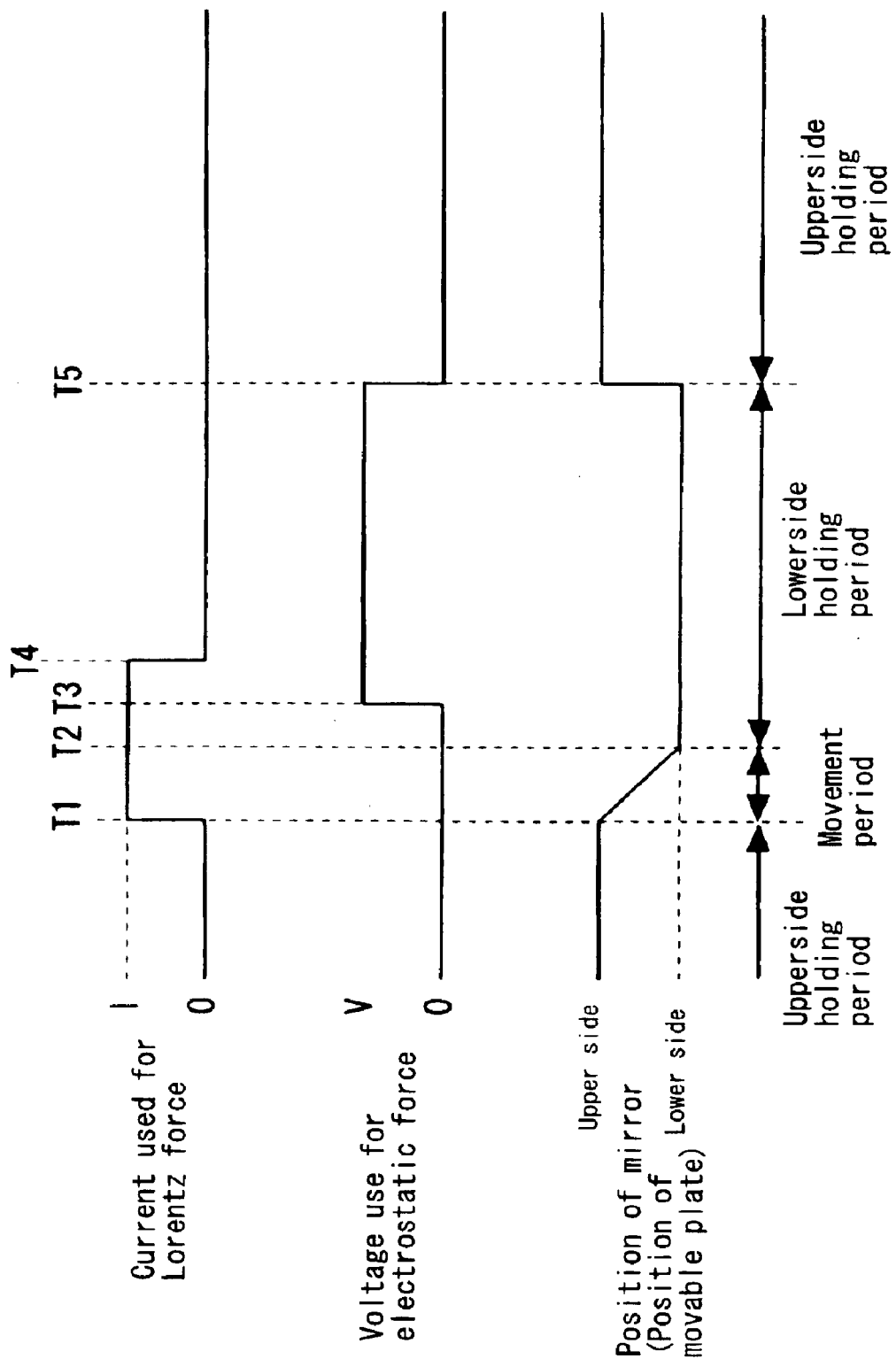
FIG. 6 is a timing chart which shows the relationship (varying over time) of the current used for the Lorentz force, the voltage used for the electrostatic force and the position of the mirror in one of the optical switches constituting the optical switch array shown in FIG. 1.

Next, one example of the control method used, and the operation of the optical switch accomplished by this control method, will be described with reference to FIG. 6, with a focus on a single optical switch. FIG. 6 is a timing chart which shows the relationship (varying over time) of the current that flows through the coil layer 25 of one optical switch and gives rise to a Lorentz force (hereafter referred to as the "current used for the Lorentz force"), the voltage that is applied across the first electrode part (substrate 11) of this optical switch and the second electrode parts 23a and 23b of the movable plate 21, and that gives rise to an electrostatic force between these parts (hereafter referred to as the "voltage used for the electrostatic force"), and the position of the mirror 12 of this optical switch (and accordingly, the position of the movable plate 21).

Initially, it is assumed that the current used for the Lorentz force is zero and that the voltage used for the electrostatic force is zero, so that the mirror 12 is held in the upper position as shown in FIGS. 3 and 4 by the spring force of the flexure parts 27a and 27b. In this state, as is shown in FIG. 3, the incident light is reflected by the mirror 12 and advances toward the front with respect to the plane of the page.

Afterward, at time T1, control is initiated in order to switch the position of the mirror 12 to the lower position shown in FIG. 5. Specifically, at time T1, the current used for the Lorentz force is set at +I. Here, +I is a current that generates a downward-oriented Lorentz force in the coil layer 25 that is stronger than the spring force of the flexure parts 27a and 27b.

The mirror 12 is gradually lowered by this Lorentz force, and stops at time T2 at which the movable plate 21 contacts the substrate 11, so that the mirror 12 is held in the lower position shown in FIG. 5.

The mirror 12 does not continue to be held in the lower position by the Lorentz force "as is"; at time T3, the voltage used for the electrostatic force is set at V, and at time T4, the current used for the Lorentz force is reduced to zero. Here, V is a voltage that generates an electrostatic force that is stronger than the spring force of the flexure parts 27a and 27b, at least when the mirror 12 is positioned in the lower position. In the period T2–T3, the mirror 12 is held in the lower position by the Lorentz force alone; in the period T3–T4, the mirror 12 is held in the lower position by the Lorentz force and the electrostatic force, and from time T4 on, the mirror 12 is held in the lower position by the electrostatic force alone. The period T2–T4 is a so-called lower-side holding transition period in which the holding of the mirror 12 in the lower position is switched from the Lorentz force to the electrostatic force, while the period from time T4 on is a so-called steady period of lower-side holding.

During the period in which the mirror 12 is held in the lower position, as is shown in FIG. 5, the incident light passes through "as is" without being reflected by the mirror 12, and constitutes the emitted light.

Subsequently, at time T5, control is initiated in order to switch the position of the mirror 12 to the upper position shown in FIGS. 3 and 4. Specifically, at time T5, the voltage used for the electrostatic force is reduced to zero. As a result, the mirror 12 is returned to the upper position shown in FIGS. 3 and 4 relatively quickly by the spring force of the flexure parts 27a and 27b, and continues to be held in the upper position by this spring force.

Thus, when the gap between the second electrode parts 23a and 23b of the movable plate 21 and the substrate 11 (first electrode part) is large, the mirror 12 is moved into the lower position against the spring force of the flexure parts 27a and 27b by a Lorentz force whose magnitude does not depend on the position of the mirror 12 (i.e., the position of the movable plate 21). Accordingly, the mobility range of the movable plate 21 can be broadened without applying a high voltage or sacrificing small size in order to increase the electrostatic force. Furthermore, in the steady state of holding in the lower position, where the gap between the second electrode parts 23a and 23b of the movable plate 21 and the substrate 11 (first electrode part) narrows, the mirror 12 is held in the lower position by the electrostatic force alone; accordingly, the power consumption can be reduced.

Furthermore, in the example described above, the voltage used for the electrostatic force is set at V at time T3 between time T2 and time T4; however, the voltage used for the electrostatic force may be set at V at any point in time during the period T1–T4, or the voltage used for the electrostatic force may be set at V prior to time T1. Moreover, if the electrostatic force that is generated when the voltage used for the electrostatic force is set at V is smaller than the spring force of the flexure parts 27a and 27b when the movable plate 21 is positioned in the upper position, then the voltage used for the electrostatic force may also be set at V during the upper-side holding period after the movable plate 21 has moved into the upper position following time T5. The voltage refresh period on the right side in the example shown in FIG. 8 (described later) corresponds to such a case.

Figure 7:
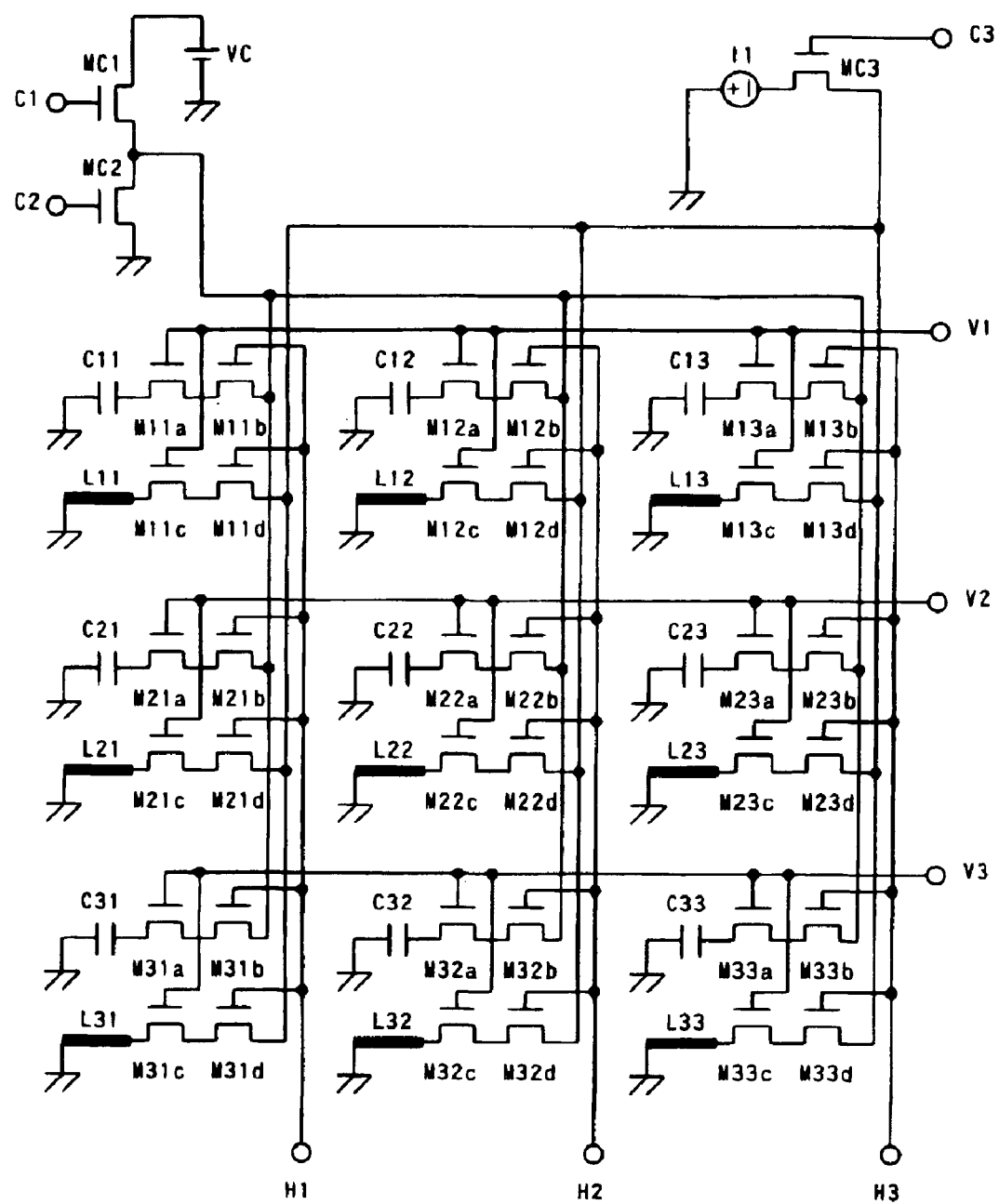
FIG. 7 is an electrical circuit diagram which shows the optical switch array shown in FIG. 1.

The optical switch array 1 shown in FIG. 1 has a plurality of optical switches of the type shown in FIGS. 2 through 5 as the above-mentioned unit elements; these optical switches are disposed in a two-dimensional matrix. Furthermore, the circuit shown in FIG. 7, which contains a plurality of switching elements, is mounted on the optical switch array 1 shown in FIG. 1 in order to realize the above-mentioned control for each of these optical switches using a small number of control lines. FIG. 7 is an electrical circuit diagram which shows the optical switch array 1.

In FIG. 7, nine optical switches are disposed in three rows and three columns in order to simplify the description. Of course, there are no restrictions on these numbers; for example, the principle is the same in a case where there are optical switches disposed in 100 rows and 100 columns.

In terms of the electrical circuit involved, the single optical switch shown in FIGS. 2 through 5 may be viewed as a single capacitor (corresponding to a composite capacitor in which a capacitor formed by the second electrode 23a and first electrode (substrate 11) and a capacitor formed by the second electrode 23b and first electrode (substrate 11) are connected in parallel), and a single coil (corresponding to the coil layer 25). In FIG. 7, the capacitors and coils of the optical switches in m rows and n columns are respectively designated as Cmn and Lmn. For example, the capacitor and coil of the optical switch at the upper left (first row, first column) in FIG. 7 are respectively designated as C11 and L11.

In the circuit shown in FIG. 7, in order to reduce the number of control lines, column selection switches Mmnb and Mmnd and row selection switches Mmna and Mmnc are respectively provided for the capacitors Cmn and coils Lmn. One end of each capacitor Cmn is connected to one end of the corresponding row selection switch Mmna, the other end of this row selection switch Mmna is connected to one end of the corresponding column selection switch Mmnb, and the other end of this column selection switch Mmnb is connected to one end of a voltage control switch MC1 and one end of a voltage control switch MC2. The other end of each capacitor Cmn is connected to ground. The other end of the voltage control switch MC1 is connected to a clamping voltage VC, and the other end of the voltage control switch MC2 is connected to ground.

Furthermore, one end of each coil Lmn is connected to one end of the corresponding row selection switch Mmnc, the other end of this row selection switch Mmnc is connected to one end of the corresponding column selection switch Mmnd, and the other end of this column selection switch Mmnd is connected to one end of a current control switch MC3. The other end of each coil Lmn is connected to ground. The other end of the current control switch MC3 is connected to one end of a current source I1 that supplies the above-mentioned current +I, and the other end of the current source I1 is connected to ground.

The column selection switches Mmnb and Mmnd, row selection switches Mmna and Mmnc, voltage control switches MC1 and MC2 and current control switch MC3 used as switching elements can be constructed from (for example) N-type MOS transistors formed on the substrate 11 in cases where a silicon substrate is used as the substrate 11.

The gates of the row selection switches M11a, M11c, M12a, M12c, M13a and M13c of the first row are connected to a terminal V1. Similarly, the gates of the row selection switches of the second row are connected to a terminal V2, and the gates of the row selection switches of the third row are connected to a terminal V3.

The gates of the column selection switches M11b, M11d, M21b, M21d, M31b and M31d of the first column are connected to a terminal H1. Similarly, the gates of the column selection switches of the second column are connected to a terminal H2, and the gates of the column selection switches of the third column are connected to a terminal H3.

Figure 8:
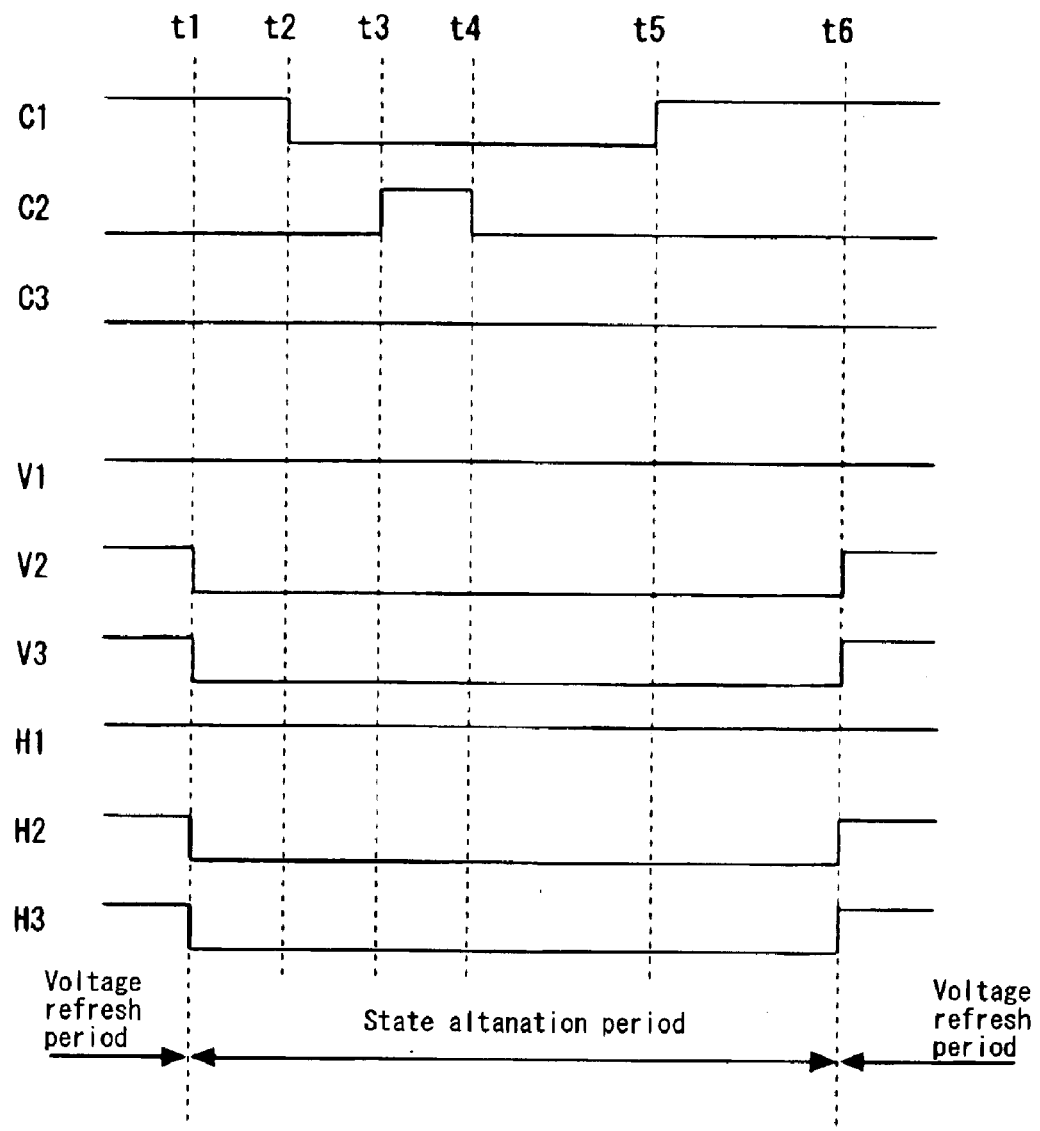
FIG. 8 is a timing chart which shows the signals that are supplied to the respective terminals in FIG. 7.

Next, one example of a timing chart of the voltages that are applied to the respective terminals V1, V2, V3, H1, H2, H3, C1, C2 and C3 is shown in FIG. 8. In FIG. 8, the time period prior to time t1 is a voltage refresh period in which the capacitors Cmn of all of the optical switches are biased to a clamping voltage VC. Accordingly, during this period, the terminals V1, V2, V3, H1, H2 and H3 are all at a high level, and all of the column selection switches Mmnb and Mmnd and row selection switches Mmna and Mmnc are in a conductive state. Furthermore, during this period, the terminal C1 is at a high level, and the terminal C2 is at a low level, so that the voltage control switch MC1 is in a conductive state, and the voltage control switch MC2 is in a non-conductive state. Furthermore, the terminal C3 is at a low level, so that the current control switch MC3 is in a non-conductive state. During the voltage refresh period, the mirrors 12 are held in either the upper position or the lower position. In the example shown in FIG. 8, the mirrors 12 are held in the lower position during the voltage refresh period prior to time t1.

Incidentally, in the present working configuration, the signals (voltages) that are applied to the terminals V1, V2, V3, H1, H2, H3, C1, C2 and C3 are supplied as control signals from the external control circuit 6 shown in FIG. 1. For example, the external control circuit 6 investigates optical switches whose position state is to be altered from the current position state on the basis of light path switching state command signals, and successively sets state alteration periods one at a time for each of the optical switches whose state is to be altered. In cases where there are no optical switches whose position state is to be altered from the current position state, the above-mentioned voltage refresh period is set. Furthermore, in cases where a plurality of state alteration periods are set (that is, in cases where the number of optical switches whose position state is to be altered from the current position state is two or greater), voltage refresh periods may be set between the respective state alteration periods, or such voltage refresh periods may be omitted. For example, in a case where the number of optical switches whose position state is to be altered from the current position state is three, a sequence of state alteration period→voltage refresh period→state alteration period→voltage refresh period→state alteration period may be set, or state alteration periods may be continuously set. Furthermore, in the respective set state alteration periods, signals that are applied to the terminals V1, V2, V3, H1, H2, H3, C1, C2 and C3 are supplied so that the above-mentioned control shown in FIG. 6 is realized in accordance with the commanded light path switching states for the corresponding optical switches. Moreover, it goes without saying that the external control circuit 6 may also be mounted on the optical switch array 1.

FIG. 8 shows an example in which a sequence of voltage refresh period→state alteration period for the optical switch of row 1 column 1→voltage refresh period is set by the external control circuit 6. In the example shown in FIG. 8, the mirrors 12 are held in the lower position during the voltage refresh period prior to time t1. At time t1, a state alteration period for the optical switch of row 1 column 1 is initiated, and the terminals V2, V3, H2 and H3 are placed at a low level, so that the capacitors other than the capacitor C11 are isolated. Next, at time t3, the terminal C2 is placed at a high level, so that the charge of C11 is discharged, and the voltage used for the electrostatic force is reduced to zero. This time t3 corresponds to time T5 in FIG. 6. As a result, the electrostatic force is eliminated, so that the mirror 12 moves to the upper position shown in FIGS. 3 and 5, and is held in this position. Next, at time t4, the terminal C2 is placed at a low level, and at time t5, the terminal C1 is placed at a high level. Subsequently, at time t6, this state alteration period is ended, and a voltage refresh period is initiated.

During the period extending from time t1 to time t6, the holding of the mirrors 12 of the optical switches other than the optical switch of row 1 column 1 in the lower position is accomplished by the voltage that is generated by the charges remaining in the respective capacitors. Accordingly, it is desirable that the respective capacitors be manufactured so that there is little charge leakage when the MOS switches are in a non-conductive state.

Figure 9:
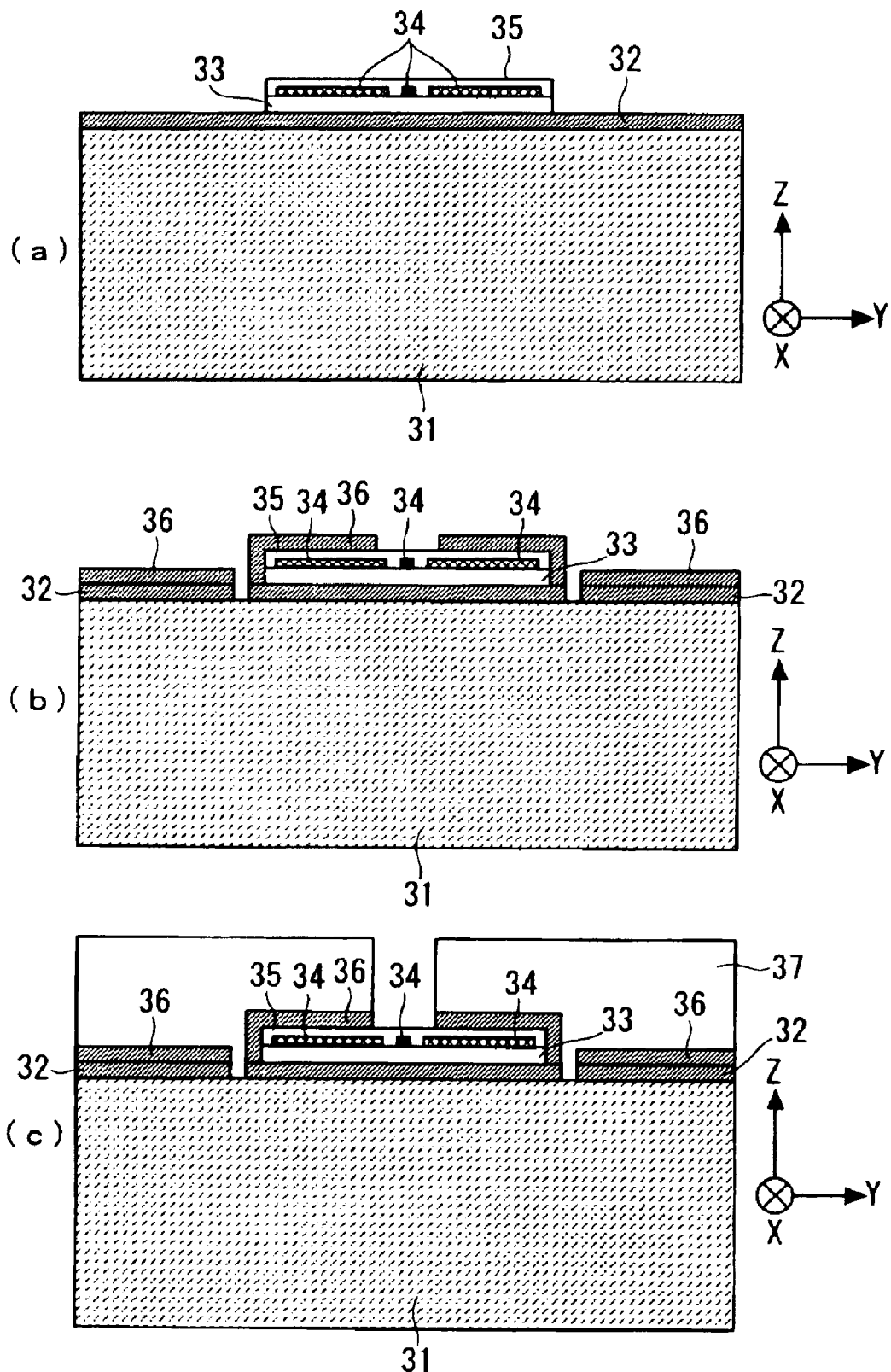
FIG. 9 is a schematic sectional view which shows in model form the respective processes of the optical switch array shown in FIG. 1.
Figure 10:
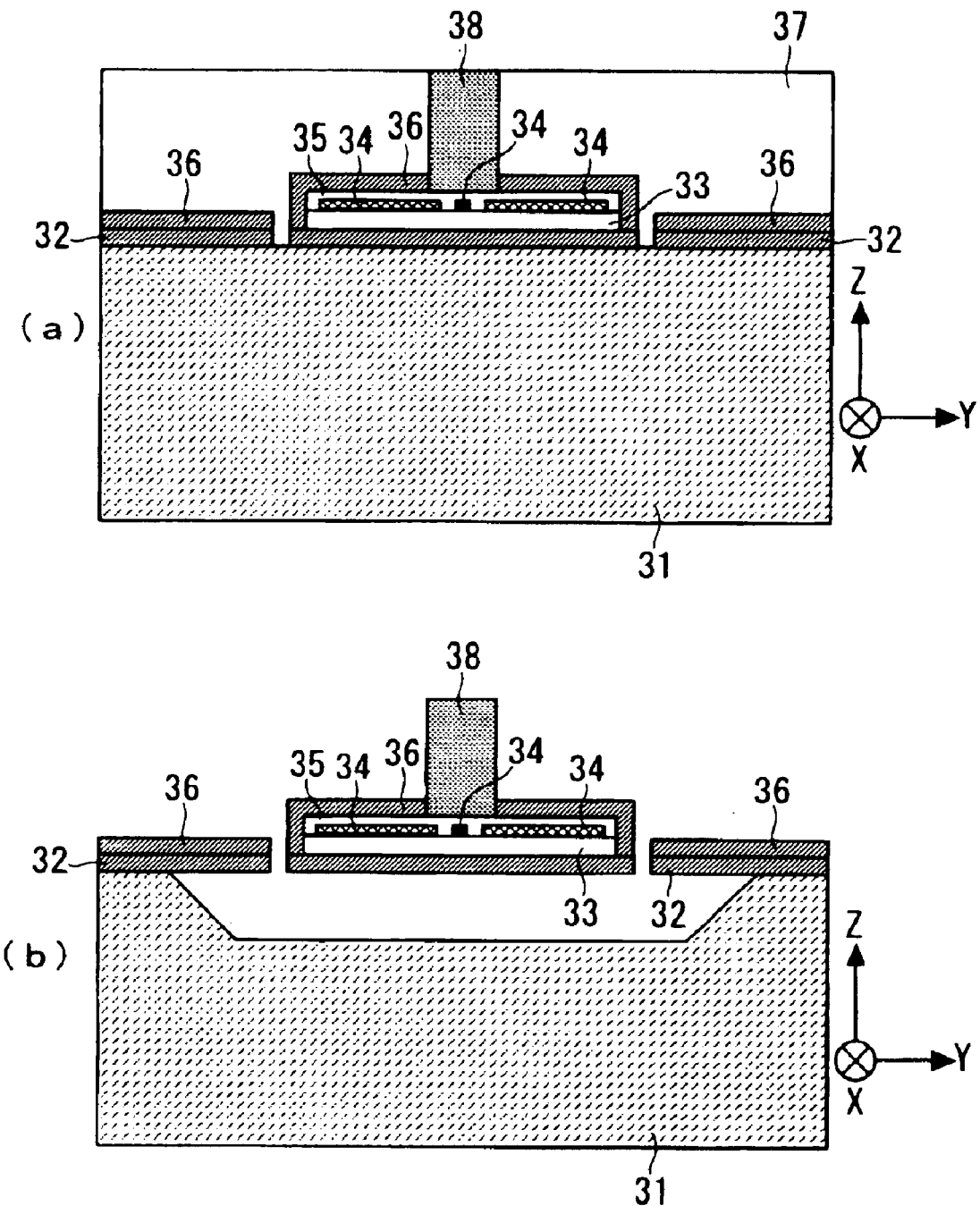
FIG. 10 is a schematic sectional view which shows in model form other respective processes of the optical switch array shown in FIG. 1.

Next, one example of the method used to manufacture the optical switch array 1 constituting the present working configuration will be described with reference to FIGS. 9 and 10. The respective diagrams shown in FIGS. 9 and 10 are schematic sectional views that illustrate this manufacturing process in model form, and correspond to FIG. 4.

First, MOS transistors (not shown in the figures) that constitute the switches Mmna, Mmnb, Mmnc, Mmnd, MC1, MC2 and MC3 shown in FIG. 7 are formed by an ordinary MOS process on a silicon substrate 31 that is to form the above-mentioned substrate 11. Furthermore, the wiring (not shown in the figures) that is necessary in order to realize the circuit shown in FIG. 7 is formed on the silicon substrate 31. An SiO$_2$ film 32 is formed on the surface of the substrate 31 in this state. Next, an SiN film 33 that is to form the lower-side insulating film 22 is formed on top of the SiO$_2$ film 32. Furthermore, holes used for connection are formed by a photo-etching method in the SiO$_2$ film 32 and SiN film 33 in locations where the wiring patterns 24a, 24b, 29a and 29b are to be connected to the MOS transistors formed on the substrate 31. An Al film 34 that is to form the electrode parts 23a and 23b, wiring patterns 24a, 24b, 29a and 29b and coil layer 25 is formed by a vapor deposition method, etc., on the substrate 31 in this state; this film is then patterned to form the shapes of these parts. Afterward, an SiN film 35 that is to form the upper-side insulating film 26 is formed, and the SiN films 33 and 35 are patterned into the shapes of the movable plate 21, flexure parts 27a and 27b and anchoring parts 28a and 28b by a photo-etching method (FIG. 9(a)).

Next, an SiO$_2$ film 36 is formed on the substrate 31 in the state shown in FIG. 9(a). Then, this film 36 is removed in the location where the mirror 12 is to be formed in the SiO$_2$ film 36, and the SiO$_2$ films 32 and 36 are removed in the locations where etching holes are to be formed in the SiO$_2$ films 32 and 36 (FIG. 9(b)).

Next, the substrate in the state shown in FIG. 9(b) is thickly coated with a resist 37. Here, the resist 37 is exposed and developed so that a region where the mirror 12 is grown is formed in the resist 37 (FIG. 9(c)). Subsequently, Au, Ni or some other metal 38 that is to form the mirror 12 is grown by electroplating (FIG. 10(a)).

Next, after the resist 37 has been removed, a KOH solution is injected via the etching holes, and portions of the substrate 31 are removed (FIG. 10(b)). Finally, the remaining SiO$_2$ films 32 and 36 are removed. As a result, the optical switch array 1 of the present working configuration is completed.

[Second Working Configuration]

Figure 11:
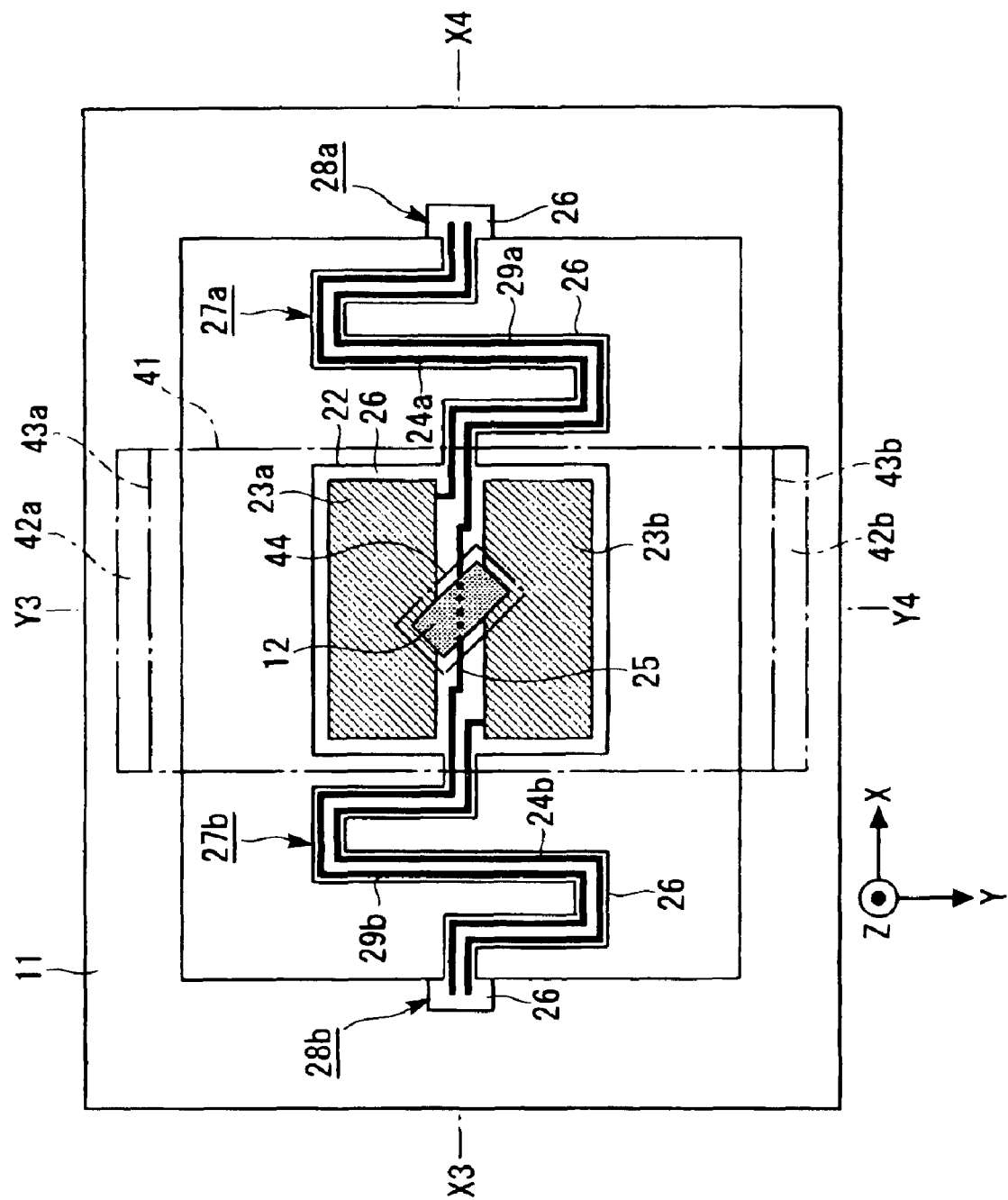
FIG. 11 is a schematic plan view which shows one of the optical switches constituting an optical switch array that constitutes a second working configuration of the present invention.
Figure 12:
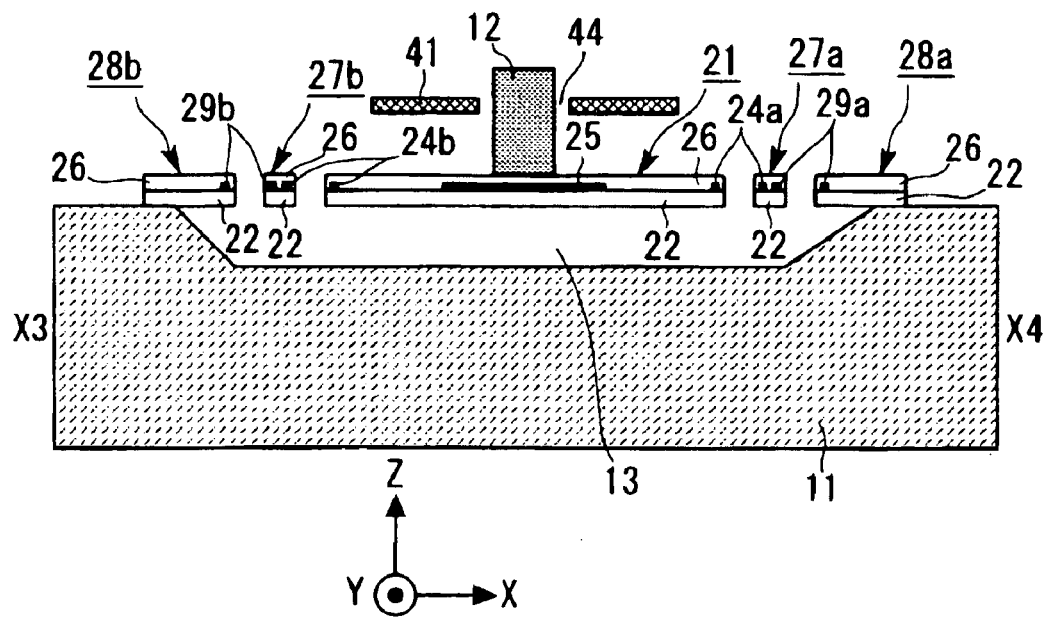
FIG. 12 is a schematic sectional view along line X3–X4 in FIG. 11.
Figure 13:
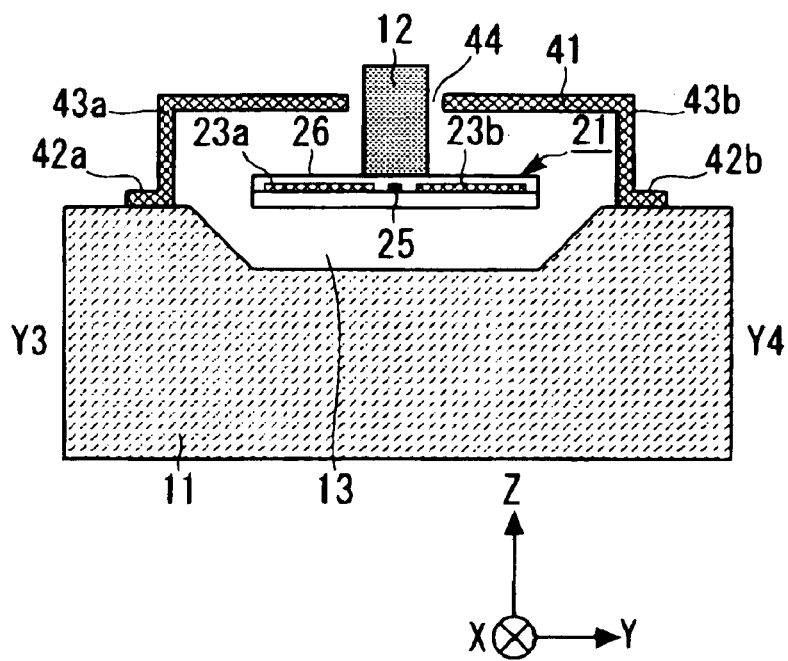
FIG. 13 is a schematic sectional view along line Y3–Y4 in FIG. 11.
Figure 14:
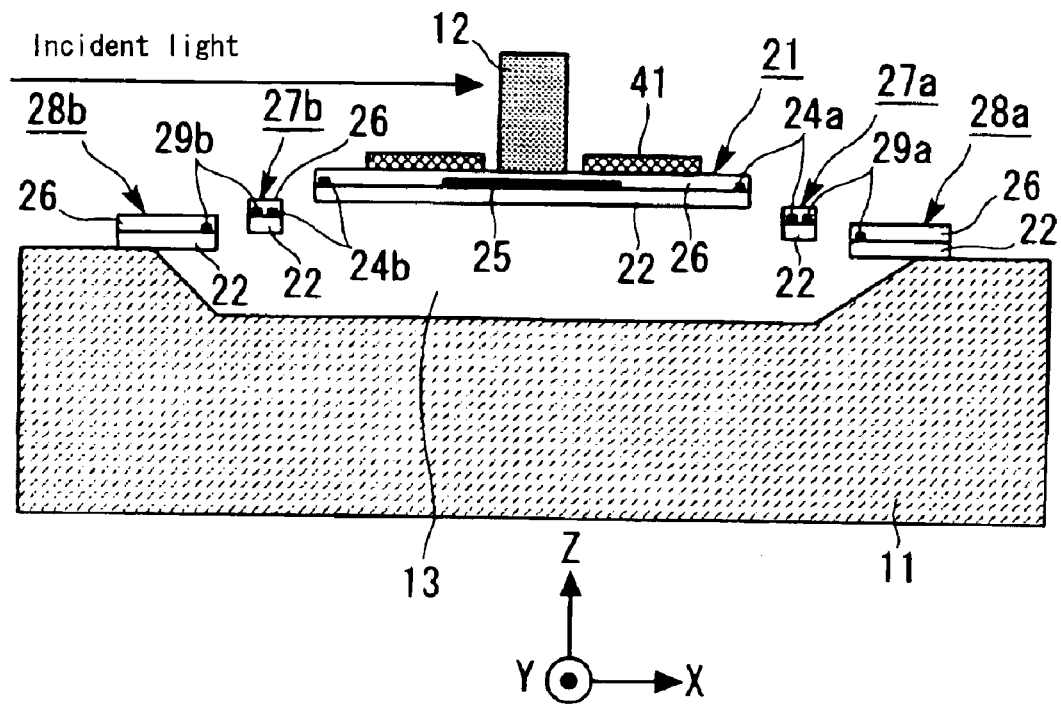
FIG. 14 is a schematic sectional view corresponding to FIG. 12.
Figure 15:
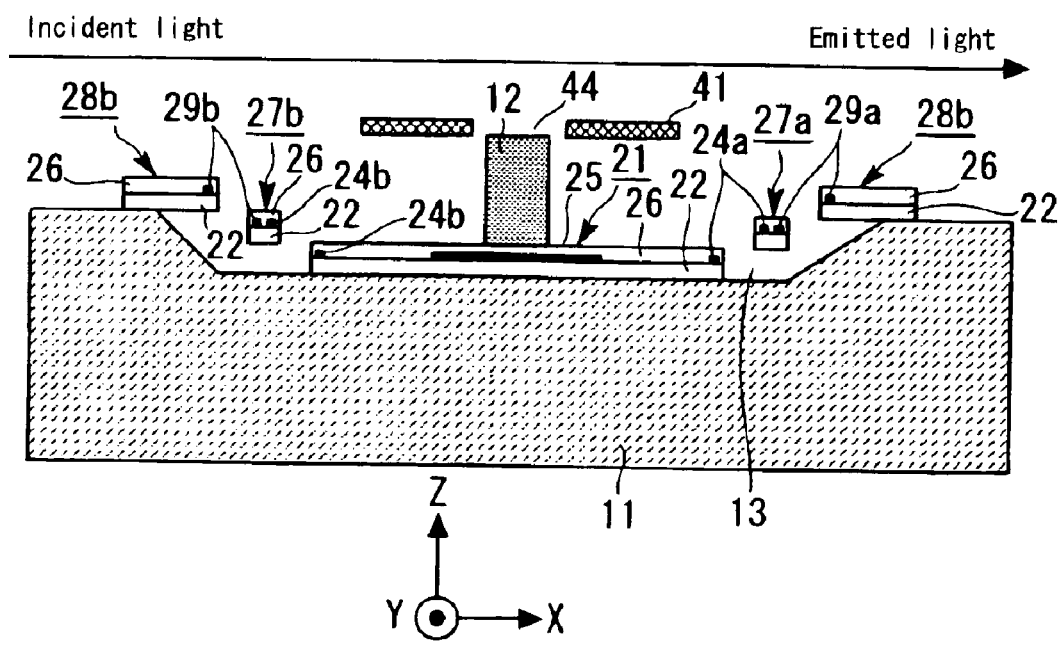
FIG. 15 is another schematic sectional view corresponding to FIG. 12.

FIG. 11 is a schematic plan view which shows one optical switch used as a unit element in an optical switch array constituting a second working configuration of the present invention. In FIG. 11, the upper electrode part 41 should actually be indicated by a solid line; however, in order to facilitate understanding, this electrode part 41 is indicated by an imaginary line. FIG. 12 is a schematic sectional view along line X3–X4 in FIG. 11. FIG. 13 is a schematic sectional view along line Y3–Y4 in FIG. 11. FIG. 14 is a schematic sectional view corresponding to FIG. 12, and shows a state in which the mirror 12 is held in the upper position. FIG. 15 is a schematic sectional view corresponding to FIG. 12, and shows a state in which the mirror 12 is held in the lower position. Furthermore, like the above-mentioned FIGS. 3 and 4, FIGS. 12 and 13 show a state in which the movable plate 21 is positioned in the position to which this movable plate 21 is returned by the spring force (returning force) of the flexure parts 27a and 27b when no electrostatic force or Lorentz force acts on the movable plate 21; in the present working configuration, this position is called the neutral position.

In FIGS. 11 through 15, element that are the same as elements in FIGS. 1 through 5 or that correspond to such elements are labeled with the same symbols, and a redundant description is omitted.

The optical switch array of the present working configuration can be used instead of the optical switch array 1 in the optical switch system shown in FIG. 1. The optical switch array of the present working configuration differs from the optical switch array 1 shown in FIG. 1 in that an upper electrode part (third electrode part) 41 that is disposed above the movable plate 21 is added in the single optical switches that are used as unit elements.

The upper electrode part 41 is formed using polysilicon as the material of this part. In FIGS. 11 through 15, 42a and 42b indicate upper electrode anchoring parts, 43a and 43b indicate rising parts, and 44 indicates a through-hole that is formed in the central portion of the upper electrode part 41. The upper electrode part 41 is constructed as an integral unit with the rising parts 43a and 43b and upper electrode anchoring parts 42a and 42b, and is mechanically connected to the peripheral portions of the recessed part 13 in the substrate 11 via the rising parts 43a and 43b and upper electrode anchoring parts 42a and 42b in that order. Thus, since the upper electrode part 41 is fastened to the substrate 11, the upper electrode part 41 constitutes a fixed part together with the substrate 11.

In the present working configuration, the electrode parts 23a and 23b of the movable plate 21 act not only as second electrode parts that are capable of generating an electrostatic force between these electrode parts and the first electrode part (substrate 11), but also as fourth electrode parts that are capable of generating an electrostatic force between these electrode parts and the upper electrode part (third electrode part) 41. Of course, instead of such a combined use, it would also be possible (for example) to form a metal film, etc., constituting such a fourth electrode part on top of the insulating film 26 in the movable plate 21, and to form a further insulating film on top of this fourth electrode part.

Furthermore, in the present working configuration, the movable plate 21 is devised so that this movable plate can move between an upper position (second position) (see FIG. 14) in which the movable plate 21 moves upward from the above-mentioned neutral position and contacts the upper electrode part 41, and a lower position (first position) (see FIG. 15) in which the movable plate 21 advances into the recessed part 13 of the substrate 11, and contacts the bottom part of this recessed part. In the upper position shown in FIG. 14, the gap between the second electrode parts 23*a* and 23*b* of the movable plate 21 and the substrate 11 used as a first electrode part is widened, so that the electrostatic force that can be generated between these electrode parts drops or disappears, and the gap between the second electrode parts 23*a* and 23*b* of the movable plate 21 and the upper electrode part (third electrode part) 41 is narrowed, so that the electrostatic force that can be generated between these electrode parts is increased. On the other hand, in the lower position shown in FIG. 15, the gap between the second electrode parts 23*a* and 23*b* of the movable plate 21 and the substrate 11 used as a first electrode part is narrowed, so that the electrostatic force that can be generated between these electrode parts is increased, and the gap between the second electrode parts 23*a* and 23*b* of the movable plate 21 and the upper electrode part (third electrode part) 41 is widened, so that the electrostatic force that can be generated between these electrode parts drops or disappears.

In the present working configuration, the first electrode part (substrate 11) and the upper electrode part 41 used as a third electrode part are electrically connected in common. As a result, with reference to the second electrode parts 23*a* and 23*b* of the movable plate 21, the same voltage is simultaneously applied across the second electrode parts 23*a* and 23*b* of the movable plate 21 and the first electrode part (substrate 11), and across the second electrode parts 23*a* and 23*b* of the movable plate 21 and the upper electrode part 41 used as a third electrode part. Of course, it would also be possible to devise the system so that the first electrode part (substrate 11) and upper electrode part 41 used as a third electrode part are not electrically connected, and so that voltages can be applied independently across the second electrode parts 23*a* and 23*b* of the movable plate 21 and the first electrode part (substrate 11), and across the second electrode parts 23*a* and 23*b* of the movable plate 21 and the upper electrode part 41 used as a third electrode part.

Furthermore, a microactuator which drives the mirror 12 is formed by the constituent elements other than the mirror 12 in the structure of the optical switch shown in FIGS. 11 through 15.

Figure 16:
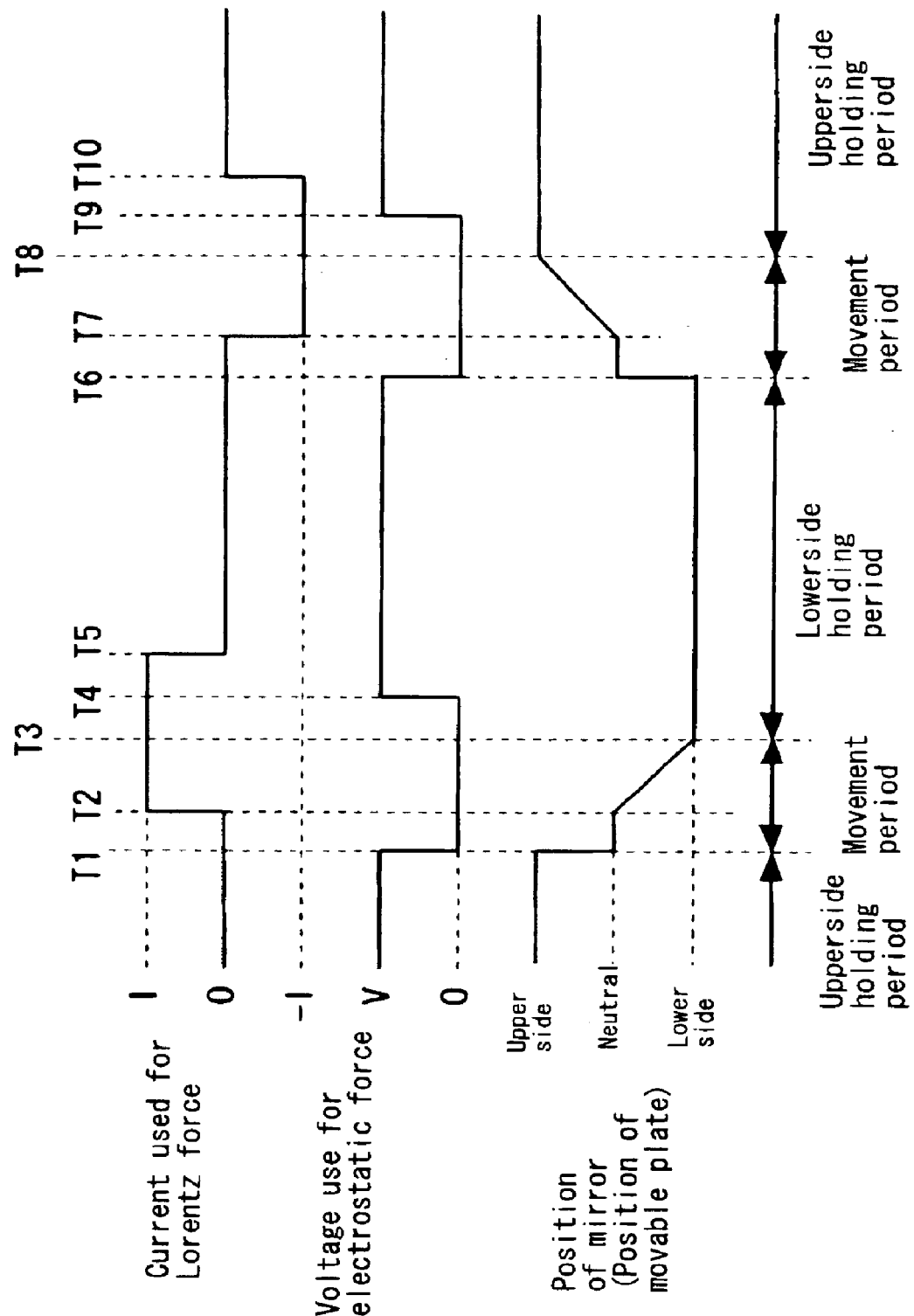
FIG. 16 is a timing chart which shows the relationship (varying over time) of the current used for the Lorentz force, the voltage used for the electrostatic force and the position of the mirror in one of the optical switches shown in FIG. 11.

Next, one example of the control method used in the present working configuration, and the operation of the optical switch accomplished by this control method, will be described with reference to FIG. 16, with a focus on a single optical switch. FIG. 16 is a timing chart which shows the relationship (varying over time) of the current that flows through the coil layer 25 of one optical switch and gives rise to a Lorentz force (hereafter referred to as the "current used for the Lorentz force"), the same voltage that is applied across the first electrode part (substrate 11) of this optical switch and the second electrode parts 23*a* and 23*b* of the movable plate 21 and across the second electrode parts 23*a* and 23*b* of the movable plate 21 of this optical switch and the upper electrode part (third electrode part), and that gives rise to respective electrostatic forces between these parts (hereafter referred to as the "voltage used for the electrostatic force"), and the position of the mirror 12 of this optical switch (and accordingly, the position of the movable plate 21).

Initially, it is assumed that the current used for the Lorentz force is zero and that the voltage used for the electrostatic force is V, so that the mirror 12 is held in the upper position shown in FIG. 14 by the electrostatic force between the electrode parts 23*a* and 23*b* of the movable plate 21 and the upper electrode part 41. In this case, the voltage V is set so that the electrostatic force between the electrode parts 23*a* and 23*b* and the upper electrode part 41 is stronger than the spring force of the flexure parts 27*a* and 27*b*. In this state, the incident light is reflected by the mirror 12 and advances toward the front with respect to the plane of the page as shown in FIG. 14.

Subsequently, at time T1, control is initiated in order to switch the position of the mirror 12 to the lower position shown in FIG. 15. Specifically, at time T1, the voltage used for the electrostatic force is reduced to zero. As a result, the mirror 12 is caused to return to the neutral position shown in FIGS. 12 and 13 relatively quickly by the spring force of the flexure parts 27*a* and 27*b*.

Subsequently, at time T2, the current used for the Lorentz force is set at +I. Here, +I is a current that generates a downward-oriented Lorentz force that is stronger than the spring force of the flexure parts 27*a* and 27*b* in the coil layer 25.

The mirror 12 is gradually lowered by this Lorentz force, and stops at time T3, at which the movable plate 21 contacts the substrate 11; the mirror 12 is then held in the lower position shown in FIG. 15.

The mirror 12 does not continue to be held "as is" in the lower position by this Lorentz force; after the voltage used for the electrostatic force is set at V at time T4, the current used for the Lorentz force is reduced to zero at time T5. Here, the voltage V is the same as the value described above; this voltage V is set at a voltage which generates an electrostatic force that is stronger than the spring force of the flexure parts 27*a* and 27*b* when the mirror 12 is positioned in the lower position. During the period T3–T4, the mirror 12 is held in the lower position only by the Lorentz force; during the period T4–T5, the mirror 12 is held in the lower position by the Lorentz force and the electrostatic force, and during the period from time T5 on, the mirror 12 is held in the lower position only by the electrostatic force. The period T3–T5 is a so-called lower-side holding transition period in which the holding of the mirror 12 in the lower position is switched from the Lorentz force to the electrostatic force, and the period from time T5 on is a so-called steady period of lower-side holding.

During the period in which the mirror 12 is held in the lower position, as is shown in FIG. 15, the incident light passes through "as is" to form emitted light without being reflected by the mirror 12.

Subsequently, at time T6, control is initiated in order to switch the position of the mirror 12 to the upper position shown in FIG. 14. Specifically, at time T6, the voltage used for the electrostatic force is reduced to zero. As a result, the mirror 12 is returned to the neutral position shown in FIGS.

12 and 13 relatively quickly by the spring force of the flexure parts 27a and 27b.

Subsequently, at time T7, the current used for the Lorentz force is set at −I. Here, −I is a current that generates an upward-oriented Lorentz force that is stronger than the spring force of the flexure parts 27a and 27b in the coil layer 25.

The mirror 12 is gradually raised by this Lorentz force, and stops at time T8, at which the movable plate 21 contacts the upper electrode part 41; the mirror 12 is then held in the upper position shown in FIG. 14.

The mirror 12 does not continue to be held "as is" in the upper position by this Lorentz force; after the voltage used for the electrostatic force is set at V at time T9, the current used for the Lorentz force is reduced to zero at time T10. During the period T8–T9, the mirror 12 is held in the upper position only by the Lorentz force; during the period T9–T10, the mirror 12 is held in the upper position by the Lorentz force and the electrostatic force, and during the period from time T10 on, the mirror 12 is held in the upper position only by the electrostatic force. The period T8–T10 is a so-called upper-side holding transition period in which the holding of the mirror 12 in the upper position is switched from the Lorentz force to the electrostatic force, and the period from time T10 on is a so-called steady period of upper-side holding.

Thus, when the gap between the second electrode parts 23a and 23b of the movable plate 21 and the substrate 11 (first electrode part) is large, the mirror 12 is moved into the lower position against the spring force of the flexure parts 27a and 27b by a Lorentz force whose magnitude does not depend on the position of the mirror 12 (i.e., the position of the movable plate 21). Furthermore, when the gap between the second electrode parts 23a and 23b of the movable plate 21 and the upper electrode part 41 (third electrode part) is large, the mirror 12 is moved into the upper position against the spring force of the flexure parts 27a and 27b by a Lorentz force whose magnitude does not depend on the position of the mirror 12. Accordingly, the mobility range of the movable plate 21 can be broadened without applying a high voltage or sacrificing small size in order to increase the electrostatic force. Furthermore, in the steady state of holding in the lower position, where the gap between the second electrode parts 23a and 23b of the movable plate 21 and the substrate 11 (first electrode part) narrows, and the steady state of holding in the upper position, where the gap between the second electrode parts 23a and 23b of the movable plate 21 and the upper electrode part 41 (third electrode part) narrows, the mirror 12 is held in the lower position or upper position by the electrostatic force alone; accordingly, the power consumption can be reduced.

Furthermore, in the last example described above, the voltage used for the electrostatic force is set at V at time T4 between time T3 and time T5; however, the voltage used for the electrostatic force may be set at V at any point in time during the period T1–T4. Similarly, in the last example described above, the voltage used for the electrostatic force is set at V at time T9 between time T8 and time T10; however, the voltage used for the electrostatic force may be set at V at any point in time during the period T6–T9.

Figure 17:
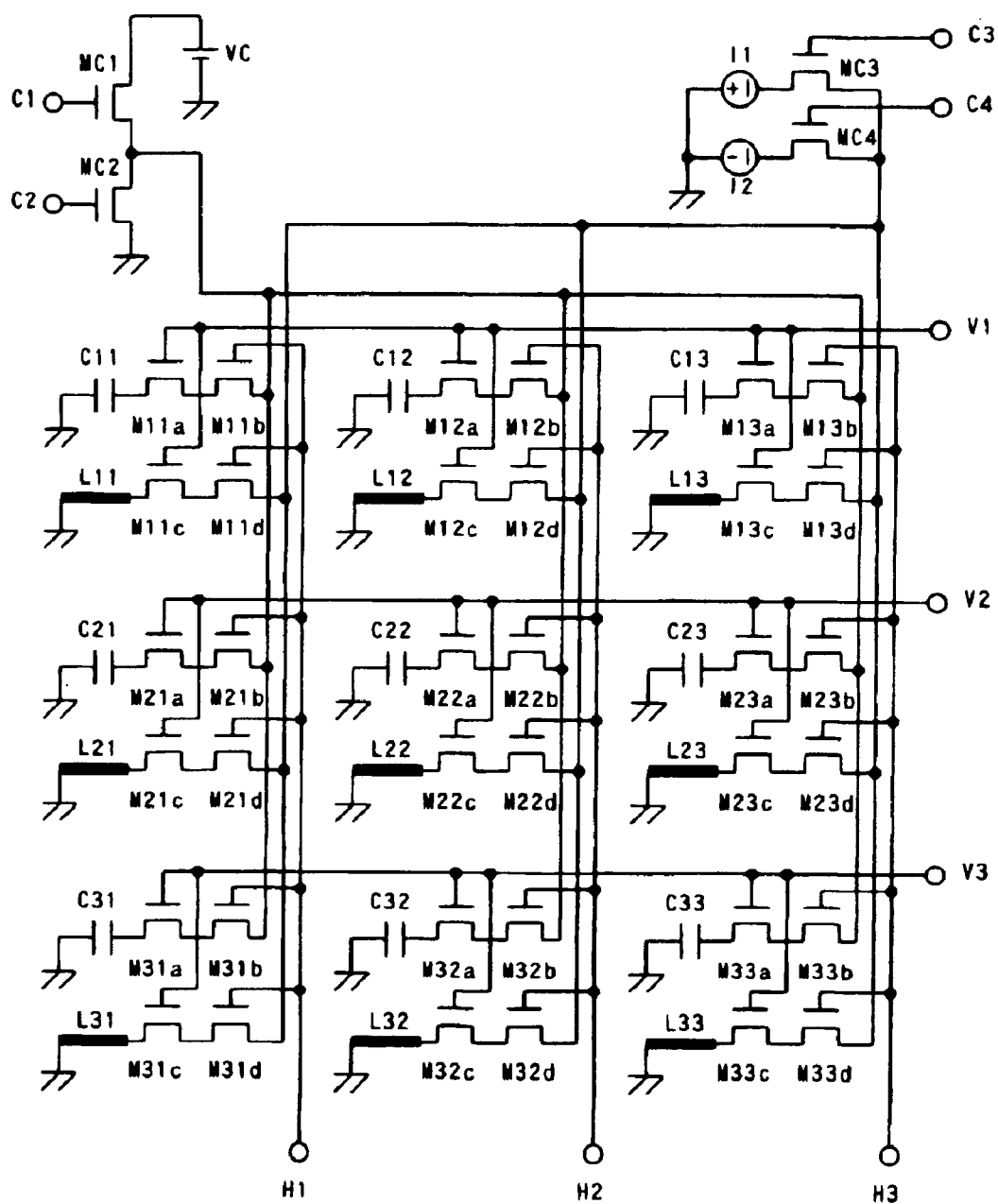
FIG. 17 is an electrical circuit diagram which shows the optical switch array constituting a second working configuration of the present invention.

The optical switch array 1 of the present working configuration has a plurality of optical switches of the type shown in FIGS. 11 through 15 as the above-mentioned unit elements, and these optical switches are disposed in a two-dimensional matrix. Furthermore, the circuit shown in FIG. 17, which contains a plurality of switching elements, is mounted on the optical switch array 1 of the present working configuration in order to realize the above-mentioned control for each of these optical switches using a small number of control lines. FIG. 17 is an electrical circuit diagram which shows the optical switch array of the present working configuration. In FIG. 17, elements that are the same as in FIG. 7, or that correspond to such elements, are labeled with the same symbols, and a redundant description is omitted.

The circuit shown in FIG. 17 differs from the circuit shown in FIG. 7 in that a current control switch MC4 and a current source I2 that supplies the above-mentioned current −I are added. One end of the current control switch MC4 is connected to the second end of each column selection switch Mmnd, and the other end of the current control switch MC4 is connected to one end of the current source I2. The other end of the current source I2 is connected to ground. The gate of the current control switch MC4 is connected to a terminal C4.

Furthermore, in FIG. 17, the capacitors Cmn of the optical switches in m rows and n columns correspond to composite capacitors in which the capacitors formed by the second electrode 23a and first electrode (substrate 11), the capacitors formed by the second electrode 23b and first electrode (substrate 11), the capacitors formed by the second electrode 23a and upper electrode part 41 (third electrode part) and the capacitors formed the second electrode 23b and upper electrode part 41 are connected in parallel.

Figure 18:
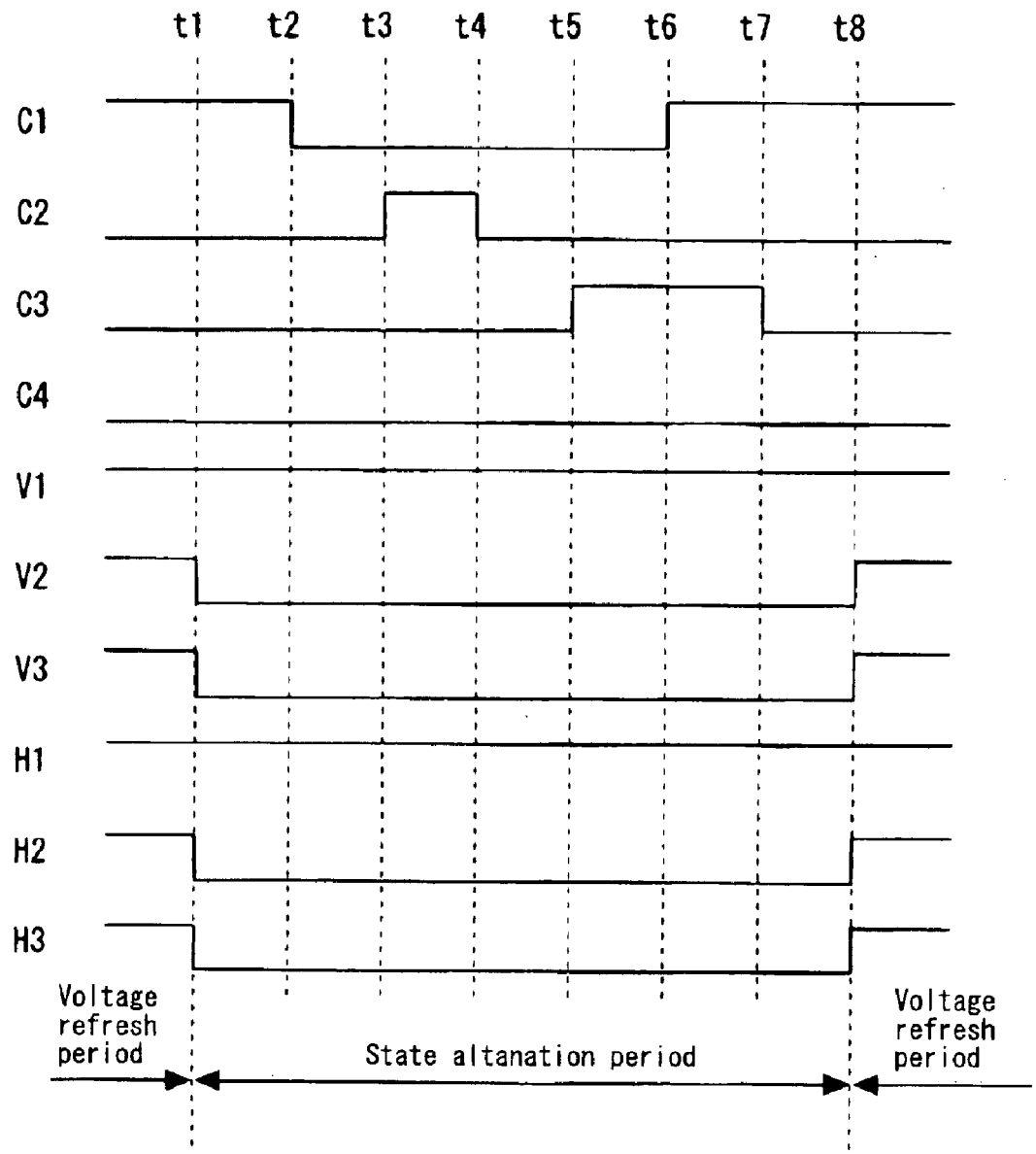
FIG. 18 is a timing chart which shows the signals that are supplied to the respective terminals in FIG. 17.

Next, one example of a timing chart of the voltages that are applied to the respective terminals V1, V2, V3, H1, H2, H3, C1, C2, C3 and C4 is shown in FIG. 18. In FIG. 18, the period prior to time t1 is a voltage refresh period in which the capacitors Cmn of all of the optical switches are biased to a clamping voltage VC. Accordingly, during this period, the terminals V1, V2, V3, H1, H2 and H3 are all at a high level, so that all of the column selection switches Mmnb and Mmnd and row selection switches Mmna and Mmnc are in a conductive state. Furthermore, during this period, the terminal C1 is at a high level, and the terminal C2 is at a low level, so that the voltage control switch MC1 is in a conductive state, and the voltage control switch MC2 is in a non-conductive state. Furthermore, the terminals C3 and C4 are at a low level, so that the current control switches MC3 and MC4 are in a non-conductive state. During the voltage refresh period, the mirrors 12 are held in either the upper position or the lower position.

In the present working configuration, incidentally, the signals (voltages) that are applied to the terminals V1, V2, V3, H1, H2, H3, C1, C2, C3 and C4 are supplied as control signals from an external control circuit corresponding to the external control circuit 6 shown in FIG. 1. Like the external control circuit 6 shown in FIG. 1, this external control circuit investigates optical switches whose position state is to be altered from the current position state (for example) on the basis of light path switching state command signals, and successively sets state alteration periods one at a time for each of the optical switches whose state is to be altered. In cases where there are no optical switches whose position state is to be altered from the current position state, the above-mentioned voltage refresh period is set. Furthermore, in cases where a plurality of state alteration periods are set (that is, in cases where the number of optical switches whose position state is to be altered from the current position state is two or greater), voltage refresh periods may be set between the respective state alteration periods, or such voltage refresh periods may be omitted. For example, in a case where the number of optical switches whose position state is to be altered from the current position state is three, a sequence of state alteration period→voltage refresh period→state alteration period→voltage refresh period→state alteration period may be set, or state alteration periods may be continuously set. Furthermore, in the respective set state alteration periods, signals that are applied to the terminals V1, V2, V3, H1, H2, H3, C1, C2, C3 and C4 are supplied so that the above-mentioned control shown in FIG. 6 is realized in accordance with the commanded light path switching states for the corresponding optical switches. Moreover, it goes without saying that the external control circuit 6 may also be mounted on the optical switch array 1.

FIG. 18 shows an example in which a sequence of voltage refresh period→state alteration period for the optical switch of row 1 column 1→voltage refresh period is set by the external control circuit 6. In the example shown in FIG. 18, during the voltage refresh period prior to time t1, the mirror 12 is held in either the upper position or the lower position. At time t1, a state alteration period is initiated for the optical switch of row 1 column 1; the terminals V2, V3, H2 and H3 are placed at a low level, so that the capacitors other than the capacitor C11 are isolated. Nest, at time t3, the terminal C2 is placed at a high level, so that the charge in C11 is discharged, and the voltage used for the electrostatic force is reduced to zero. As a result, the electrostatic force is eliminated, so that the mirror 12 moves into the neutral position shown in FIGS. 12 and 13. Next, after the terminal C2 is placed at a low level at time t4, the terminal C3 is placed at a high level at time t5, so that a current +I is caused to flow through the coil L11. In cases where the direction of movement is the opposite direction, C4 is placed at a high level instead of C3, so that a current −I is caused to flow. Next, at time t6, the terminal C1 is placed at a high level, so that the capacitor C11 is again charged to a clamping voltage VC, thus causing clamping to be performed. Next, at time t7, the terminal C3 is placed at a low level, so that the current to the coil L11 is stopped. Subsequently, at time t8, this state alteration period is ended, and a voltage refresh period is initiated.

Furthermore, the optical switch array of the present working configuration can basically be manufactured in the same manner as the optical switch array 1 of the above-mentioned first working configuration. In the present working configuration, since an upper electrode part 41 is added, alterations may be appropriately made, such as the formation of the upper electrode part 41 following the formation of a sacrificial layer corresponding to the gap between the movable plate 21 and upper electrode part 41.

In the respective working configurations described above, if a high voltage were to be applied across the electrode parts, it would be necessary to increase the withstand voltage of the MOS transistors in FIGS. 7 and 8. However, MOS transistors that have a high withstand voltage have a large planar size, so that chip miniaturization becomes difficult. On the other hand, in the respective working configurations described above, there is no need to apply a high voltage across the electrode parts; accordingly, MOS transistors with a small planar size can be used. In this respect as well, miniaturization can be achieved.

Respective working configurations of the present invention were described above. However, the scope of the present invention is not limited by these working configurations.

For example, the respective working configurations described above were examples of optical switch arrays in which a plurality of optical switches were disposed in a two-dimensional configuration. However, the present invention may also comprise a single optical switch. Furthermore, the respective working configurations described above were examples in which the microactuator of the present invention was applied to an optical switch; however, there are no limitations on the application of this microactuator.

INDUSTRIAL APPLICABILITY

The microactuator and microactuator device of the present invention can be used to drive devices with an extremely small structure such as devices manufactured by micro-machining. For example, the optical switch and optical switch array of the present invention can be used in optical communications, etc.

What is claimed is:

1. A microactuator comprising:
   a fixed part including a first electrode part;
   a movable part which is movably disposed with respect to the fixed part, and which includes a second electrode part such that an electrostatic force is generated between the second electrode part and the first electrode part when a voltage is applied across the first electrode part and the second electrode part; and
   a current path which is disposed in a magnetic field, and which is separated and electrically insulated from the second electrode part;
   wherein a Lorentz force is generated when current is passed through the current path.

2. The microactuator according to claim 1, wherein the movable part comprises a thin film.

3. The microactuator according to claim 1, wherein the current path is positioned such that the Lorentz force is generated in a direction that causes the movable part to move into a first position where the electrostatic force is increased.

4. The microactuator according to claim 3, wherein the movable part is movable between the first position and a second position in which the electrostatic force decreases or disappears; and
   wherein a returning force which urges the movable part to the second position is generated when the movable part is displaced from the second position.

5. The microactuator according to claim 4, wherein the first electrode part and the second electrode part face each other;
   wherein the movable part is mechanically connected to the fixed part via a spring part, and a gap between the first electrode part and the second electrode part is narrower in the first position than in the second position; and
   wherein the returning force is generated by the spring part.

6. A microactuator device comprising:
   the microactuator according to claim 1;
   a magnetic field generating part that generates the magnetic field; and
   a control part that controls the voltage that is applied across the first electrode part and the second electrode part and the current that flows through the current path.

7. The microactuator device according to claim 6, wherein the control part controls the voltage and the current such that:
   the movable part is caused to move into the first position by at least one of the Lorentz force and the electrostatic force;
   the movable part is held in the first position by the electrostatic force; and
   current does not flow during at least a steady holding state in which the movable part is held in the first position.

8. An optical switch comprising:

the microactuator according to claim 1; and a mirror which is disposed on the movable part.

9. An optical switch array comprising a plurality of the optical switches according to claim 8;

wherein the plurality of optical switches are disposed in a two-dimensional configuration.

10. The optical switch array according to claim 9, further comprising a circuit which includes a plurality of switching elements, and wherein said circuit controls the currant and the voltage for respective rows and columns of the optical switches in response to row selection signals and column selection signals for each row and column of the plurality of optical switches.

11. A microactuator comprising:

a fixed part including a first electrode part;

a movable part which is movably disposed with respect to the fixed part, and which includes a second electrode part such that a first electrostatic force is generated between the second electrode part and the first electrode part when a first voltage is applied across the first electrode part and the second electrode part; and a current path which is disposed in a magnetic field, and which is separated and electrically insulated from the second electrode part;

wherein a Lorentz force is generated when current is passed through the current path; and wherein the fixed part includes a third electrode part, and the movable part includes a fourth electrode part, and wherein a second electrostatic force is generated between the fourth electrode part and the third electrode part when a second voltage is applied across the fourth electrode part and the third electrode part.

12. The microactuator according to claim 11, wherein the second electrode part comprises the fourth electrode part.

13. The microactuator according to claim 11, wherein the current path is positioned such that the Lorentz force is adapted to be generated in respective directions to move the movable part into: (i) a first position where the first electrostatic is increased, and the second electrostatic force decreases or disappears, and (ii) a second position where the first electrostatic force decreases or disappears, end the second electrostatic force is increased.

14. The microactuator according to claim 13, wherein a returning force is generated which urges the movable part toward a neutral position between the first position and the second position, when the movable part is displaced from the neutral position.

15. The microactuator according to claim 14, wherein:

the first electrode part is provided on a first side of the movable part to face the second electrode part;

the third electrode part is provided on a second side of the movable part to face the fourth electrode part;

the movable part is mechanically connected to the fixed part via a spring part, a first gap between the first electrode part and the second electrode part narrows and a second gap between the third electrode part and the fourth electrode part widens when the movable part is moved to the first position, and the first gap widens and the second gap narrows when the movable part is moved to the second position, and the returning force is generated by the spring part.

16. A microactuator device comprising:

the microactuator according to claim 11;

a magnetic field generating part that generates the magnetic field; and a control part that controls the first voltage, the second voltage, and the current that flows through the current path.

17. The microactuator device according to claim 16, wherein the control part controls the first voltage, the second voltage, and the current such that:

the movable part is caused to move into the first position by at least one of the Lorentz force and the first electrostatic force, and the movable part is caused to move into the second position by at least one of the Lorentz force and the second electrostatic force;

the movable part is held in the first position by the first electrostatic force, and the movable part in the second position by the second electrostatic force; and the current does not flow during at least a first steady holding state in which the movable part is held in the first position, and a second steady holding state in which the movable part is held in the second position.

* * * * *